(12) United States Patent
Sorschag

(10) Patent No.: US 9,054,123 B2
(45) Date of Patent: Jun. 9, 2015

(54) METHOD FOR MANUFACTURING A SEMICONDUCTOR DEVICE

(71) Applicant: Infineon Technologies Austria AG, Villach (AT)

(72) Inventor: Kurt Sorschag, Villach-Landskron (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/682,995

(22) Filed: Nov. 21, 2012

(65) Prior Publication Data

US 2014/0141594 A1   May 22, 2014

(51) Int. Cl.
*H01L 21/76* (2006.01)
*H01L 21/20* (2006.01)
*H01L 21/311* (2006.01)
*H01L 29/66* (2006.01)
*H01L 29/20* (2006.01)

(52) U.S. Cl.
CPC ............. *H01L 29/66* (2013.01); *H01L 29/2003* (2013.01)

(58) Field of Classification Search
CPC ....... H01L 29/06; H01L 21/762; H01L 21/02; H01L 29/66; H01L 29/2003; H01L 29/872; H01L 29/78; H01L 21/336
USPC ......... 438/285, 259, 270, 429, 580, 504, 700; 257/494, 471, 336, 331, E21.214, 257/E21.305
See application file for complete search history.

(56) References Cited

U.S. PATENT DOCUMENTS

| | | | |
|---|---|---|---|
| 6,528,398 B1 | 3/2003 | Ghandehari et al. | |
| 2004/0144985 A1* | 7/2004 | Zhang et al. | 257/79 |
| 2007/0026629 A1 | 2/2007 | Chen et al. | |
| 2007/0264809 A1* | 11/2007 | Richieri | 438/580 |
| 2008/0076222 A1 | 3/2008 | Zundel et al. | |
| 2008/0083966 A1* | 4/2008 | Oonishi | 257/475 |
| 2008/0087896 A1 | 4/2008 | Chiola | |
| 2008/0173875 A1* | 7/2008 | Koshka et al. | 257/77 |
| 2010/0013552 A1* | 1/2010 | Darwish et al. | 327/581 |
| 2010/0327288 A1* | 12/2010 | Chao et al. | 257/64 |
| 2011/0220990 A1* | 9/2011 | Chang et al. | 257/330 |
| 2011/0284953 A1 | 11/2011 | Long et al. | |
| 2012/0049270 A1 | 3/2012 | Hirler et al. | |
| 2012/0205772 A1* | 8/2012 | Chen | 257/471 |
| 2013/0181319 A1* | 7/2013 | Huang et al. | 257/471 |
| 2013/0221429 A1 | 8/2013 | Yang | |
| 2013/0228891 A1* | 9/2013 | Kao et al. | 257/494 |
| 2013/0264390 A1* | 10/2013 | Frey et al. | 235/492 |

* cited by examiner

Primary Examiner — Amar Movva
Assistant Examiner — Sheikh Maruf
(74) Attorney, Agent, or Firm — Murphy, Bilak & Homiller, PLLC

(57) ABSTRACT

A method for producing a semiconductor device is provided. The method includes: providing a wafer including an upper surface and a plurality of semiconductor mesas extending to the upper surface; forming a first support structure made of a first material and adjoining the plurality of semiconductor mesas at the upper surface so that adjacent pairs of the plurality of semiconductor mesas are bridged by the first support structure; forming a second support structure made of a second material different from the first material and adjoining the plurality of semiconductor mesas at the upper surface so that the adjacent pairs of the plurality of semiconductor mesas are bridged by the second support structure; removing the first support structure; and at least partly removing the second support structure.

27 Claims, 20 Drawing Sheets

METHOD FOR MANUFACTURING A SEMICONDUCTOR DEVICE

TECHNICAL FIELD

Embodiments of the present invention relate to methods for manufacturing semiconductor devices, in particular to a method for manufacturing field-effect semiconductor devices having a plurality of semiconductor mesas.

BACKGROUND

Semiconductor transistors, in particular field-effect controlled switching devices such as a Junction Field Effect Transistor (JFET), a Metal Oxide Semiconductor Field Effect Transistor (MOSFET) and an Insulated Gate Bipolar Transistor (IGBT) have been used for various applications including but not limited to use as switches in power supplies and power converters, electric cars, air-conditioners, and even stereo systems. Due to structural efficiency and low on-resistance $R_{on}$, vertical trench MOSFETs are widely used, in particular in power applications.

Several semiconductor concepts use a sequence of thin trenches and semiconductor mesas or semiconductor lamellas. For example, one configuration of a vertical trench MOSFET is the so-called TEDFET (Trench Extended Drain Field-Effect Transistor) which allows for an improved decoupling of voltage blocking capability and on-resistance $R_{on}$ compared to conventional MOSFETs by additionally controlling the conductivity in the drift region by a drift control region which is separated from the drift region by an accumulation dielectric formed in trenches vertically extending along the drift region.

Forming the deeply into the semiconductor material extending high quality accumulation dielectrics may, for example for power TEDFETS of higher blocking capability, become complex, in particular for semiconductor mesas and intervening trenches of higher aspect ratios and small pitch. Due the reduced mechanical stability of semiconductor mesas with high aspect ratio, the risk of deflecting the semiconductor mesas, for example during wet-chemical etching processes of rinsing and drying or due to a vibration, increases. Deflecting may result in adherence of neighboring semiconductor mesas, for example due to capillary forces. Furthermore, a thin mesa may even break off. These risks may be reduced by replacing water as solvent, for example by using isopropanol. However, this approach is not satisfactory for deep vertical trenches and deeply into the semiconductor material extending thin dielectrics, respectively. Using thicker mesas requires larger areas and thus increases costs.

Accordingly, there is a need to improve manufacturing methods for semiconductor devices having a plurality of semiconductor mesa.

SUMMARY

According to an embodiment of a method for forming a semiconductor device, the method includes: providing a wafer comprising an upper surface and a plurality of semiconductor mesas extending to the upper surface, adjacent pairs of the semiconductor mesas of the plurality of semiconductor mesas being separated from each other by at least one of a trench extending from the upper surface into the wafer, and a non-semiconductor region arranged on a side-wall of the trench; forming a first support structure made of a first material and adjoining the plurality of semiconductor mesas at the upper surface so that the adjacent pairs of the semiconductor mesas are bridged by the first support structure; forming a second support structure made of a second material and adjoining the plurality of semiconductor mesas at the upper surface so that the adjacent pairs of the semiconductor mesas are bridged by the second support structure; removing the first support structure; and at least partly removing the second support structure. The second material is different from the first material.

According to an embodiment of a method for forming a TEDFET, the method includes: providing a wafer having an upper surface and a semiconductor layer extending to the upper surface. Etching wide trenches from the upper surface into the semiconductor layer to form first semiconductor mesas having sidewalls; forming sacrificial oxide layers on the sidewalls of the first semiconductor mesas; performing a selective epitaxial growth process to form second semiconductor mesas in the wide trenches between adjacent sacrificial oxide layers; forming on the upper surface a first support structure of an oxidizable material so that adjacent pairs of the first and second semiconductor mesas are bridged by the first support structure; removing the sacrificial oxide layers to expose sidewalls of the first and second semiconductor mesas; forming on the upper surface a second support structure of a non-oxidizable material so that adjacent pairs of the first and second semiconductor mesas are bridged by the second support structure; thermal oxidizing at least the sidewalls of the first and second semiconductor mesas; and at least partly removing the second support structure.

According to an embodiment of a method for forming a semiconductor device, the method includes: providing a wafer having an upper surface and a plurality of semiconductor mesas which extend to the upper surface and are, next to the upper surface and in a cross-section which is substantially orthogonal to the upper surface, spaced apart from each other; forming a first support structure of a first material and adjoining the plurality of semiconductor mesas at the upper surface so that adjacent pairs of the semiconductor mesas are bridged by the first support structure and that the first support structure is substantially arranged only above the upper surface; forming a second support structure of a second material and adjoining the plurality of semiconductor mesas at the upper surface so that the adjacent pairs of the semiconductor mesas are bridged by the second support structure and that the second support structure is substantially arranged only above the upper surface; processing a side wall of at least one of the plurality of semiconductor mesas; removing the first support structure; and at least partly removing the second support structure. The second material is different from the first material.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1:
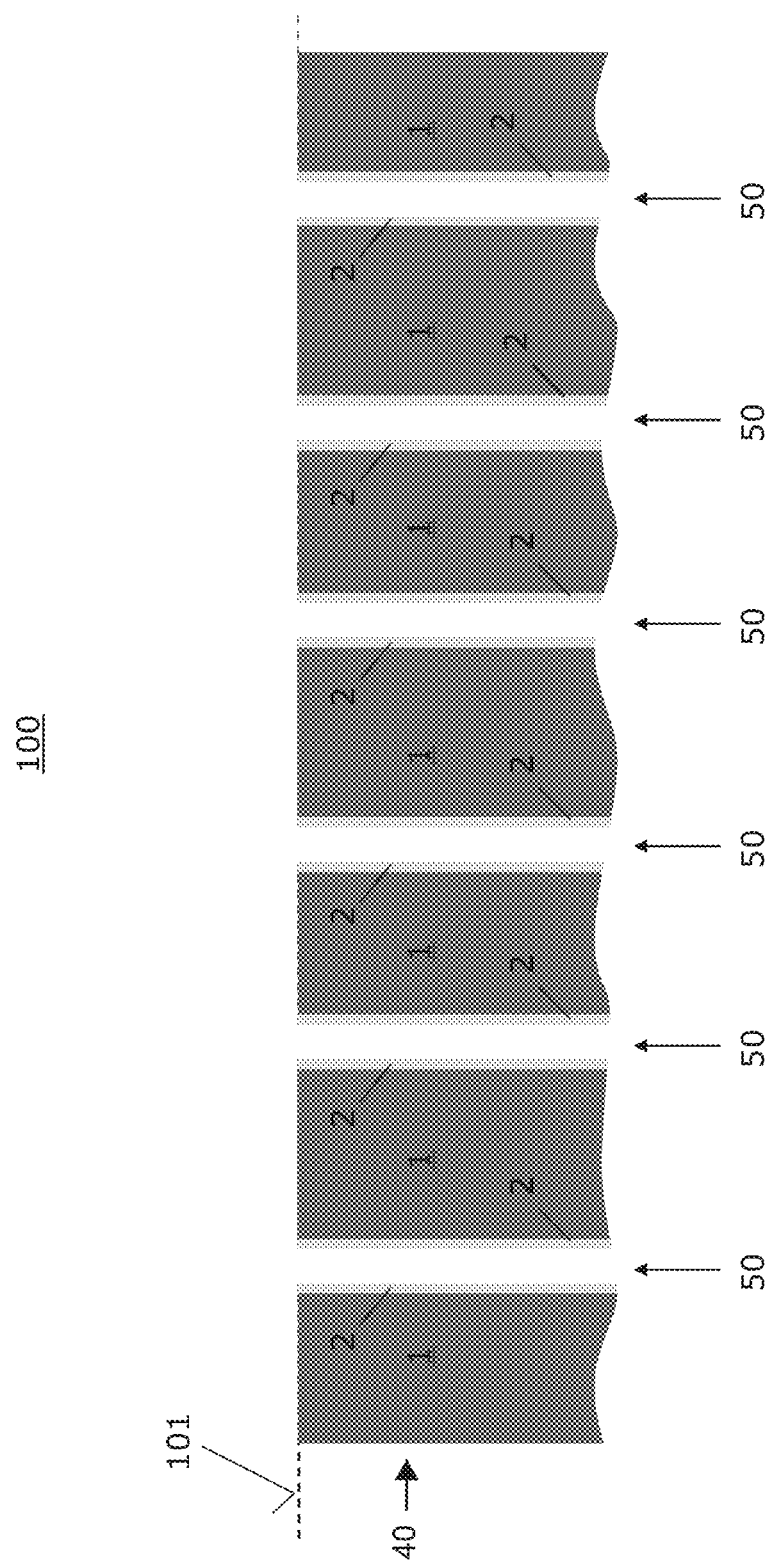
FIGS. 1 and 9 illustrate vertical cross-sections through a semiconductor body during method steps of a method according to embodiments.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main surface of a semiconductor substrate or body. This can be for instance the surface of a wafer or a die. In the following, the main surface is also referred to as upper surface.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate of semiconductor body is considered to be formed by the lower or backside surface while the first surface is considered to be formed by the upper, front or main surface of the semiconductor substrate. The terms "above" and "below" as used in this specification therefore describe a relative location of a structural feature to another structural feature with consideration of this orientation.

In this specification, p-doped is referred to as first conductivity type while n-doped is referred to as second conductivity type. Alternatively, the semiconductor devices can be formed with opposite doping relations so that the first conductivity type can be n-doped and the second conductivity type can be p-doped. Furthermore, some Figures illustrate relative doping concentrations by indicating "−" or "+" next to the doping type. For example, "$n^-$" means a doping concentration which is less than the doping concentration of an "n"-doping region while an "$n^+$"-doping region has a larger doping concentration than the "n"-doping region. However, indicating the relative doping concentration does not mean that doping regions of the same relative doping concentration have to have the same absolute doping concentration unless otherwise stated. For example, two different $n^+$-doping regions can have different absolute doping concentrations. The same applies, for example, to an $n^+$-doping and a $p^+$-doping region.

Specific embodiments described in this specification pertain to, without being limited thereto, to manufacturing methods for semiconductor devices, in particular to manufacturing methods for field effect semiconductor transistors. Within this specification the terms "semiconductor device" and "semiconductor component" are used synonymously. The semiconductor device typically includes a field-effect structure and an integrated free-wheeling diode. The field-effect structure may be a TEDFET-structure, a MOSFET or an IGBT-structure (Insulated Gate Bipolar Transistor-structure) having a pn-junction forming a body diode between a drift region of the first conductivity type and a body region of the second conductivity type. The semiconductor device is typically a vertical semiconductor device having two load metallizations, for example a source metallization and a drain metallization, which are arranged opposite to each other and in low resistive contact with a respective contact region.

Typically, the semiconductor device is a power semiconductor device having an active area with a plurality of IGBT-cells, MOSFET-cells or TEDFET-cells for carrying and/or controlling a load current between the two load metallizations. Furthermore, the power semiconductor device has typically a peripheral area with at least one edge-termination structure at least partially surrounding the active area when seen from above.

The term "power semiconductor device" as used in this specification intends to describe a semiconductor device on a single chip with high voltage and/or high current switching capabilities. In other words, power semiconductor devices are intended for high current, typically in the Ampere range. Within this specification the terms "power semiconductor device" and "power semiconductor component" are used synonymously.

The term "field-effect" as used in this specification intends to describe the electric-field mediated formation of a conductive "channel" of a first conductivity type and/or control of conductivity and/or shape of the channel between two regions of the first conductivity type. The conductive channel may be formed and/or controlled in a semiconductor region of a second conductivity type, typically a body region of the second conductivity type, which is arranged between the two regions of the first conductivity type. Due to the field-effect, a unipolar current path through the channel region is formed and/or controlled between a source region or emitter region of the first conductivity type and a drift region of the first conductivity type in a MOSFET-structure and an IGBT-structure, respectively. The drift region may be in contact with a higher doped drain region of the first conductivity type or a higher doped collector region of the second conductivity type, respectively. The drain region or the collector region is in low resistive electric contact with a drain or collector electrode. The source region or emitter region is in low resistive electric contact with a source or emitter electrode.

In the context of the present specification, the terms "in ohmic contact", in resistive electric contact" and "in resistive electric connection" intend to describe that there is an ohmic current path between respective elements or portions of a semiconductor device at least when no voltages or only low probe voltages are applied to and/or across the semiconductor device. Likewise, the terms in low ohmic contact, "in low resistive electric contact" and "in low resistive electric connection" intend to describe that there is a low resistive ohmic current path between respective elements or portions of a semiconductor device at least when no voltages are applied to and/or across the semiconductor device. Within this specification the terms "in low ohmic contact", "in low resistive electric contact", "electrically coupled", and "in low resistive electric connection" are used synonymously. In some embodiments, the resistivity of a low resistive current path between respective elements or portions of a semiconductor device which is low when low voltages are applied to and/or across the semiconductor device, for example a probe voltage of less than one or a few volts, becomes high above a threshold voltage, for example due to depleting a semiconductor region forming at least a part of the current path.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e. the term MOSFET is used in the more general term meaning of IGFET (insulated-gate field-effect transistor) and MISFET (metal-insulator-semiconductor field-effect transistor), respectively.

In the context of the present specification, the term "gate electrode" intends to describe an electrode which is situated next to, and configured to form and/or control a channel region. The term "gate electrode" shall embrace an electrode which is situated next to, and insulated from the body region by an insulating region forming a gate dielectric region and configured to form and/or control a channel region next to a heterojunction or through the body region as well as an electrode in low resistive electric contact with a gate region adjoining a channel region of an opposite doping type and configured to shape a depleted portion in the channel region by charging to an appropriate voltage.

The insulating region may be made of any suitable dielectric material such as silicon oxide, for example thermal silicon oxide, silicon nitride, siliconoxynitride or the like.

In the context of the present specification, the term "metallization" intends to describe a region or a layer with metallic or near metallic properties with respect to electric conductivity. A metallization may be in contact with a semiconductor region to form an electrode, a pad and/or a terminal of the semiconductor device. The metallization may be made of and/or comprise a metal such as Al, Ti, W, Cu and Co but may also be made of a material with metallic or near metallic properties with respect to electric conductivity such as highly doped n-type or p-type poly-Si, TiN or an electrically conductive silicide such as $TaSi_2$, $TiSi_2$, $PtSi$, $CoSi_2$, $WSi_2$ or the like. The metallization may also include different electrically conductive materials, for example a stack of those materials.

In the context of the present specification, the terms "semiconductor mesa" or "mesa region" intends to describe semiconductor regions which extend from a common substrate to a main surface of the semiconductor body or wafer and are in respective upper portions spaced apart from each other. Typically, a mesa region is, in a vertical cross-section which is substantially orthogonal to the main surface, arranged between two adjacent vertical trenches extending from the main surface into the semiconductor body or wafer.

In the following, embodiments pertaining to semiconductor devices and manufacturing methods for forming semiconductor devices are explained mainly with reference to silicon (Si) semiconductor devices. Accordingly, a monocrystalline semiconductor region or layer is typically a monocrystalline Si-region or Si-layer. It should, however, be understood that the semiconductor body can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used. If the semiconductor body comprises a high band gap material such as SiC or GaN which has a high breakdown voltage and high critical avalanche field strength, respectively, the doping of the respective semiconductor regions can be chosen higher which reduces the on-state resistance Ron in the following also referred to as on-resistance Ron.

Referring to FIGS. 1 to 10 method steps of a method for forming a semiconductor device 100 are explained. FIGS. 1 to 9 illustrate vertical cross-sections through semiconductor device 100 and a semiconductor body 40 of semiconductor device 100, respectively. Note that the semiconductor device 100 to be manufactured is typically a power semiconductor device with a plurality unit cells arranged in an active area for switching and/or controlling a vertical current. Furthermore, semiconductor device 100 is typically manufactured on wafer-level. For sake of clarity, the FIGS. 1 to 9 typically only represent a section through the wafer 40.

According to an embodiment, wafer 40 has an upper surface 101 and a plurality of semiconductor mesas 1 extending to the upper surface 101. Adjacent pairs of the semiconductor mesas 1 are separated from each by respective trenches 50 which extend from the upper surface 101 into wafer 40, and by non-semiconductor regions 2 arranged on the sidewalls of the trenches 50 and semiconductor mesas 1, respectively. The wafer 40 may for example be a silicon wafer or a silicon-on-insulator wafer (SOI-wafer). Note that FIG. 1 only illustrates an upper portion of wafer 40. The non-semiconductor regions 2 may, for example, be made of silicon oxide or carbon.

In the exemplary embodiment, the semiconductor mesas 1 and trenches 50 are substantially bar-shaped when seen from above.

Figure 2:
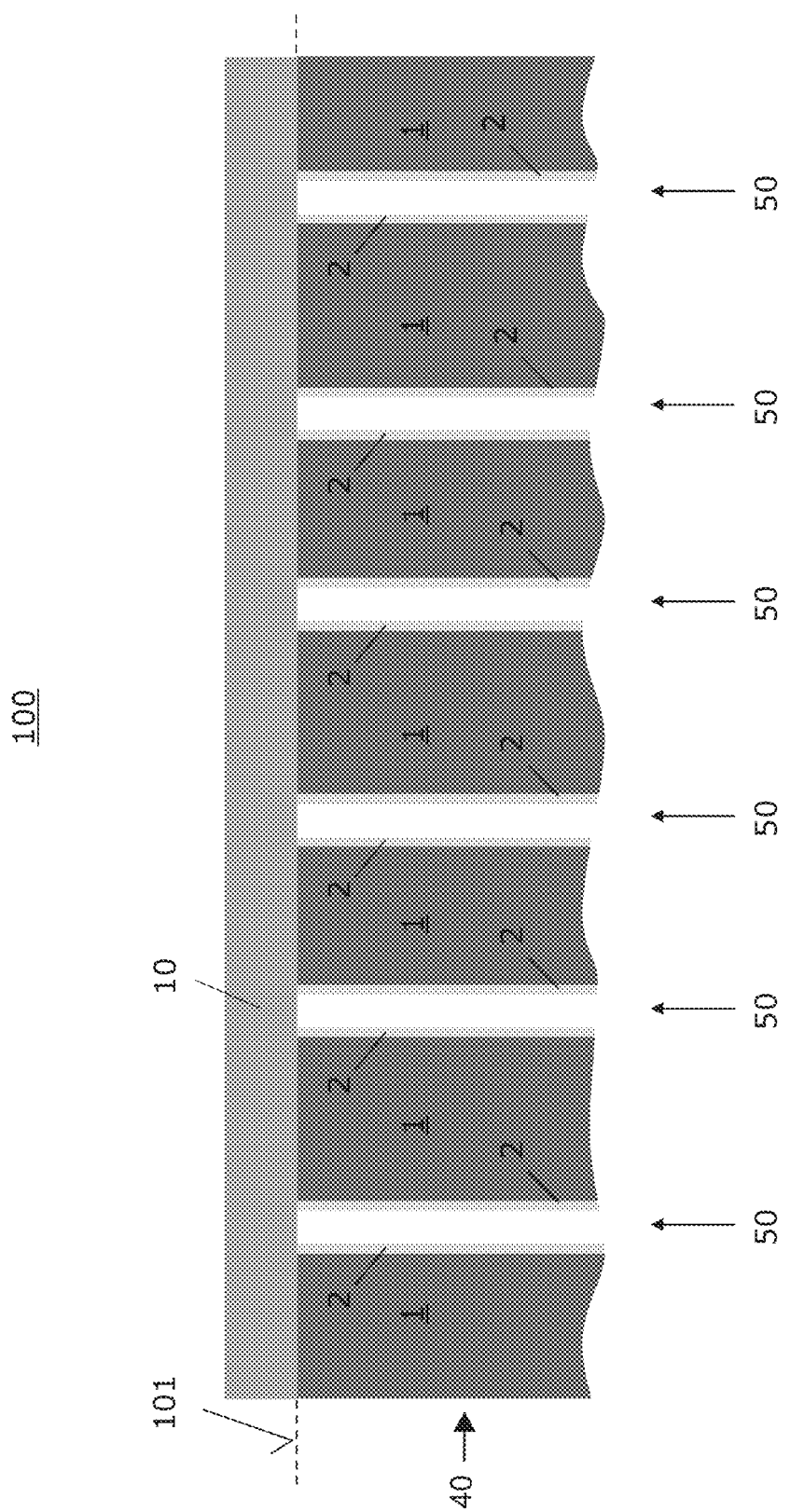

After providing wafer 40, a first support structure 10 of a first material is typically formed at the upper surface 101 so that the adjacent pairs of the semiconductor mesas 1 are bridged by the first support structure 10. As illustrated in FIG. 2, forming the first support structure 10 typically includes forming a first layer 10 of the first material which adjoins each semiconductor mesas 1 and is substantially arranged only above the plurality of semiconductor mesas 1. Accordingly, the trenches 50 remain substantially free of the first material. This facilitates further processing.

In the exemplary embodiment, first material is made of an oxidizable material such as carbon, or diamond-like carbon that may be formed in a CVD-process (Chemical Vapour Deposition). For example, the first layer 10 may be formed as amorphous carbon using a PECVD-process (Plasma-Enhanced Chemical Vapour Deposition) in a hydrocarbon rich atmosphere.

Figure 3:
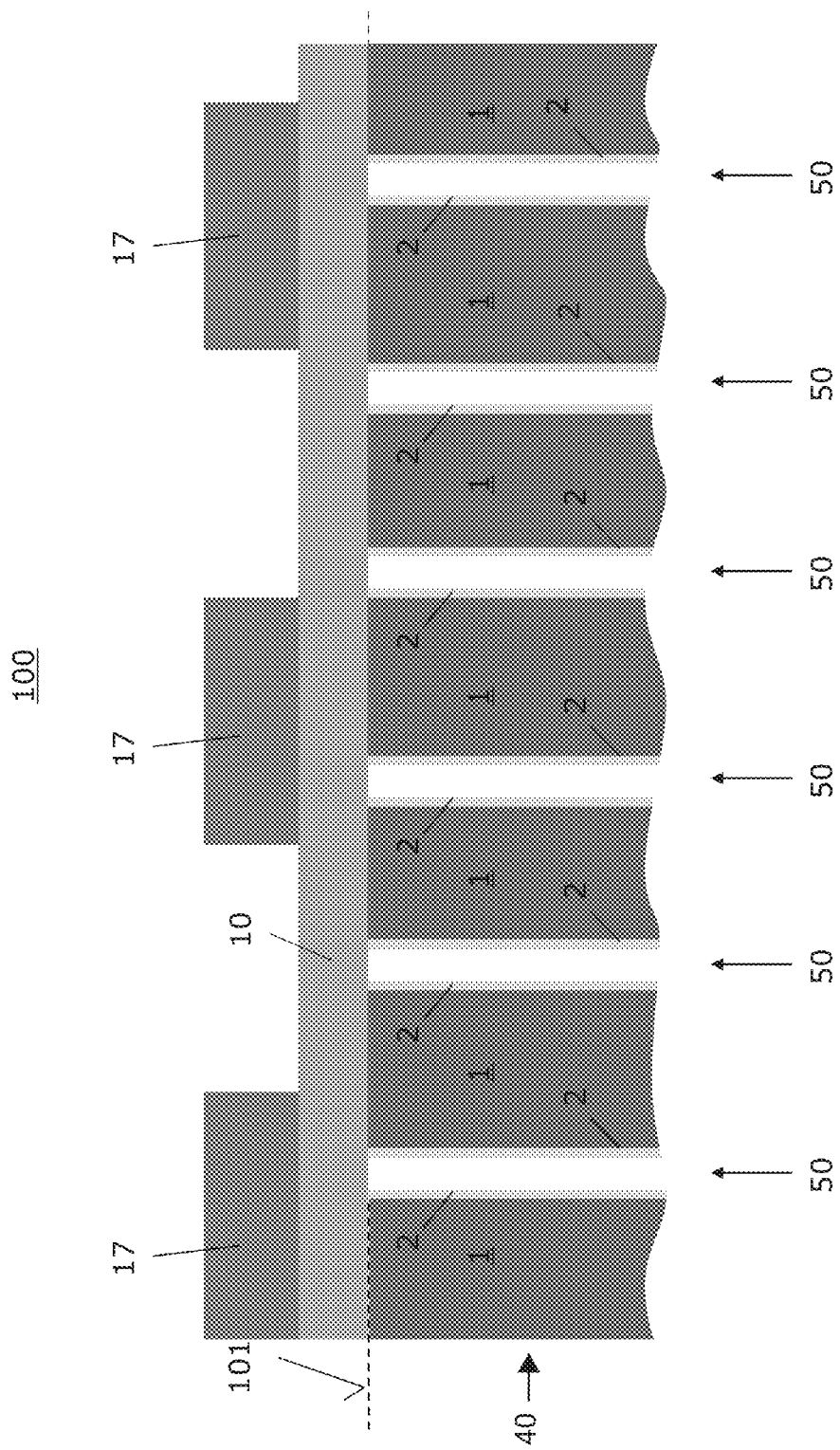

Thereafter, a mask 17 is formed on the first layer 10 as illustrated in FIG. 3. This typically includes a photolithographic process.

Figure 4:
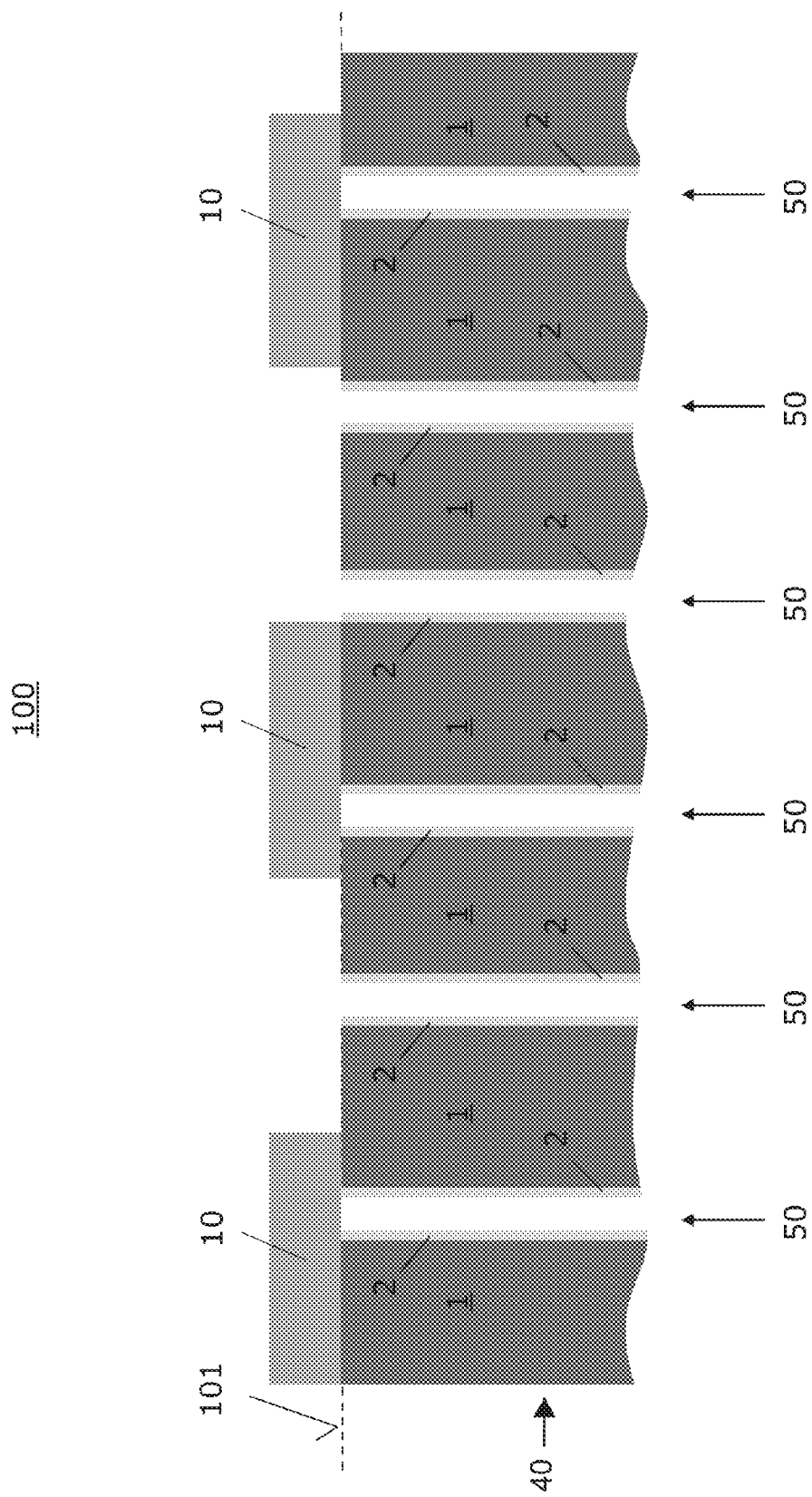

Thereafter, mask 17 is used to etch the first layer 10 thereby forming the first support structure 10. The resulting structure is illustrated in FIG. 4. Note that all semiconductor mesas 1 are typically bridged by the first support structure 10. Accordingly, semiconductor mesas 1 which are not bridged by the first support structure 10 in the vertical cross-section of FIG. 4 are typically bridged in one or more different vertical cross-section. Accordingly, the semiconductor mesas 1 are mechanically stabilized.

The vertical extension of the first support structure 10 is, depending on material properties and geometry, typically in a range from about 100 nm to about 5 μm, more typically from about 0.5 μm to about 1.5 μm to provide a sufficiently large mechanical stabilization of the mesas 1.

This facilitates further processing of the side walls of the semiconductor mesas 1 and the trenches 50, respectively, without increasing the risk of breaking off the mesas 1 and/or irreversibly forming firm contacts between adjacent mesas 1.

Figure 5:
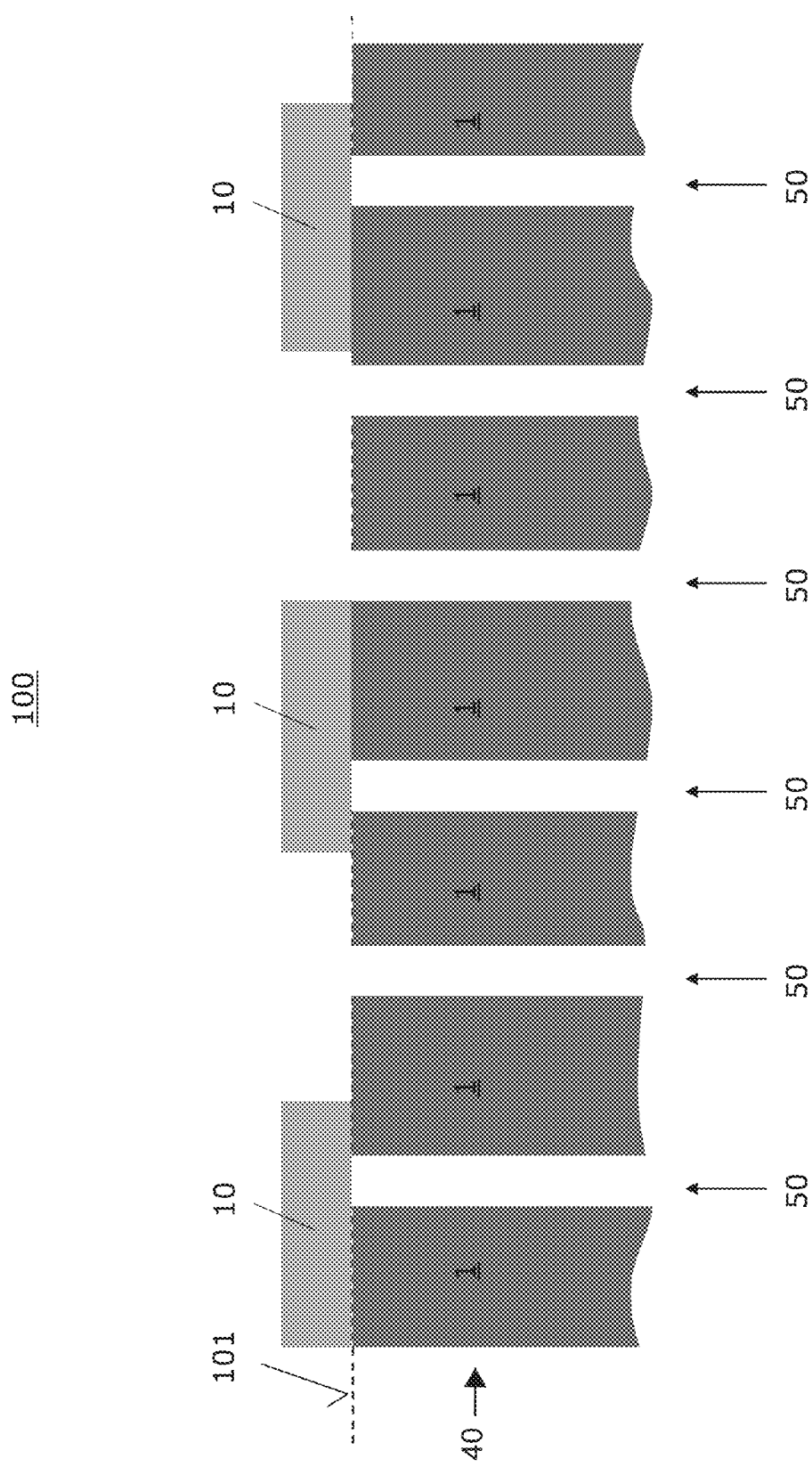

For example, the non-semiconductor regions 2 may be etched selectively to the first support structure 10 and the semiconductor mesas 1. This may be done by wet-chemical etching. The resulting semiconductor device 100 is illustrated in FIG. 5.

Figure 6:
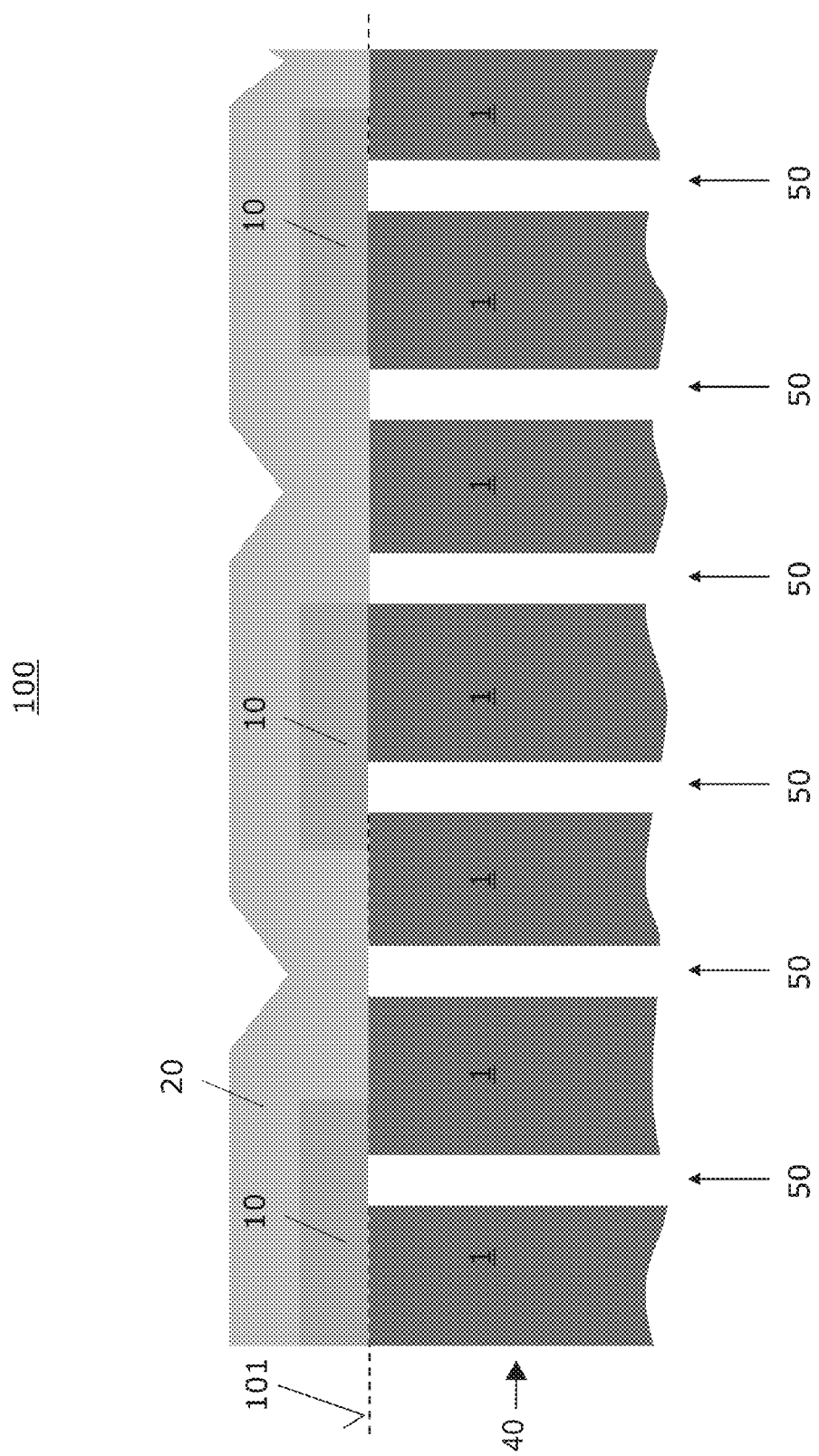

Thereafter, a second support structure 20 of a second material is typically formed on the semiconductor mesas 1. As illustrated in FIG. 6, forming the second support structure 20 typically includes forming a second layer 20 of the second material which adjoins the semiconductor mesas 1 at the upper surface 101. Similar as explained above for the first layer 10, the second layer 20 typically adjoins all semiconductor mesas 1 and is substantially arranged only above the plurality of semiconductor mesas 1. Accordingly, the trenches 50 remain substantially free of the second material. This facilitates further processing.

The second layer 20 is typically formed as a non-conformal layer using, for example, a CVD-process, more typically a PECVD-process. For example, the second layer 20 may be formed as a non-conformal USG-Layer (Undoped-Silicate-Glass-layer) or TEOS-layer (Tetra-Ethyl-Ortho-Silicate-layer) using a CVD-process.

Figure 7:
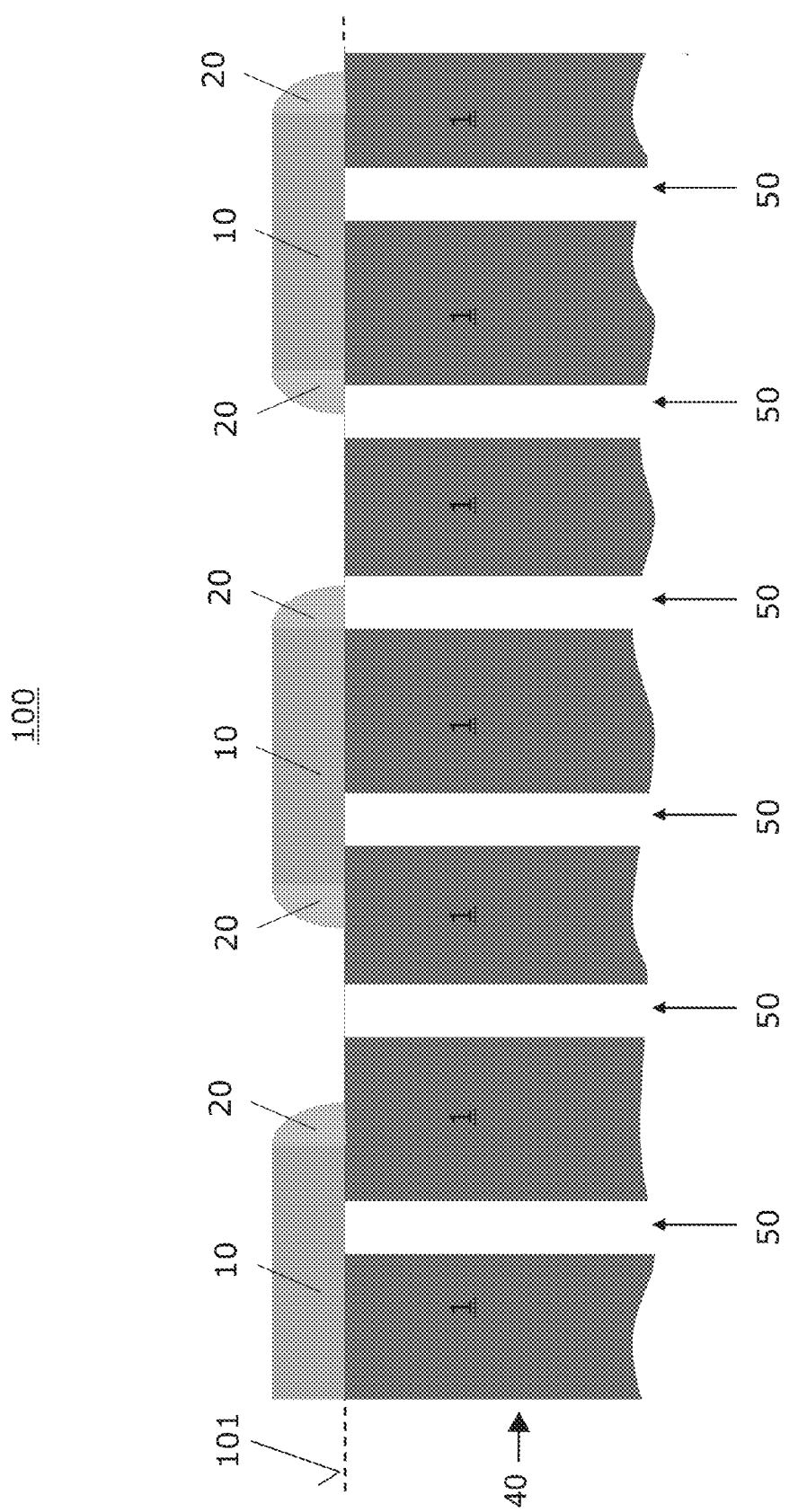

FIG. 7 illustrates the structure after a subsequent unmasked non-isotropic selective etching process, for example by plasma etching, of the second layer 20. Accordingly, a second support structure 20 which bridges adjacent pairs of the semiconductor mesas 1 is formed in a self-adjusted manner with respect to the first support structure 10. Accordingly, no further photolithographic processes are required.

The vertical extension of the second support structure 20 is, depending on material properties and geometry, typically in a range from about 100 nm to about 5 μm, more typically in a range from about 0.5 μm to about 1.5 μm to provide sufficient mechanical stability for the mesas 1 when the first support structure is subsequently removed.

As illustrated in FIGS. 10A and 10B in respective plane views on the semiconductor device 100 of FIG. 7, the semiconductor mesas 1 are typically substantially bar-shaped when seen from above. Furthermore, the second support structure 20 typically adjoins the first support structure 10 at this processing stage.

As illustrated in FIG. 10A, the first support structure 10 and the second support structure 20 typically include, when seen from above, bar-shaped portions that are tilted with respect to the semiconductor mesas 1, for example by a respective tilt angle in a range from about 25° to about 90°, more typically in a range from about 45° to about 90°.

As illustrated in FIG. 10B, the first support structure 10 may be formed as a contiguous mesh, for example as a layer 10 with circular, ellipsoidal or polygonal holes which are partly filled with respective portions of the second support structure 20.

Figure 8:
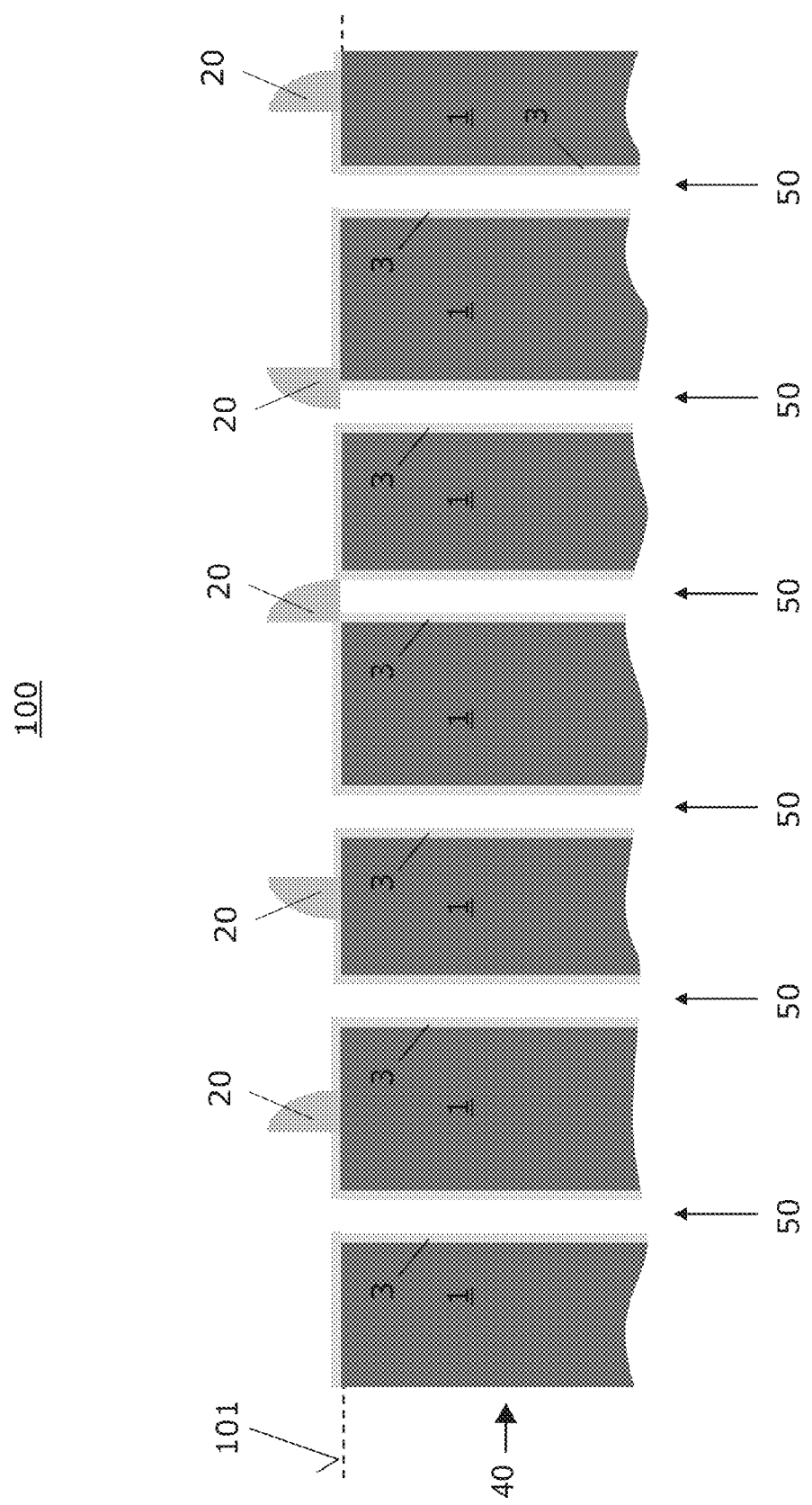

Referring to FIG. 8, a thermal oxidizing process is performed. In this embodiment, both the first support structure 10 is removed by ashing and thermal oxide layers 3 are formed on sidewalls of the semiconductor mesas 1 while the mesas 1 remain mechanically stabilized by the second support structure 20. The thermal oxide layers 3 typically form high quality dielectric layers 3 of low defect density and high breakdown voltage, respectively. Forming high quality dielectric layers 3 is, however, only one example of processing the side wall the semiconductor mesas 1 and/or the side wall or bottom walls of the trenches 50 while the mesas are mechanically supported by at least one of the first support structure 10 and the second support structure 20.

Thereafter, remaining portions of the trenches 50 are typically filled with a dielectric, semiconducting or conducting material 4. Now, the wafer is inherently stable and need no longer supporting structures on the upper surface 101 to mechanically stabilize the semiconductor mesas 1.

Typically, the semiconductor mesas 1 are stabilized without causing substantial additional wafer bow during processing the trenches 50 and semiconductor mesas 1, respectively. This may be achieved by appropriate material selection and deposition conditions for forming the first and second support structures 10, 20. For example, when a thermal oxide is to be formed at the mesa sidewalls, the second support structure 20 may be made of a non-oxidizable material such as silicon oxide, TEOS, USG (Undoped Silicate Glass), silicon nitride or the like and the first support structure 10 may be made of an oxidizable material such as carbon, for example amorphous carbon or diamond-like carbon. During a common thermal oxidizing, the first support structure 10 is removed and the second the second support structure 20 stabilizes the semiconductor mesas 1 without adding substantial additional mechanical stress. Thus, the process is neutral with respect to wafer bow. Note that thermal stress during thermal oxidizing may in addition be reduced, in particular for thin wafers, by a corresponding additional layer of the material of the second support structure 20 on the back-side of the wafer.

The materials of the first support structure 10 and the second support structures 20 may also be selectively etchable to each other. For example, the first support structure 10 may be made of silicon-nitride, an imide, or silicon that is, for removing the first support structure 10, selectively etched with respect to the second support structure 20 made of a different material such as a silicon oxide.

Figure 9:
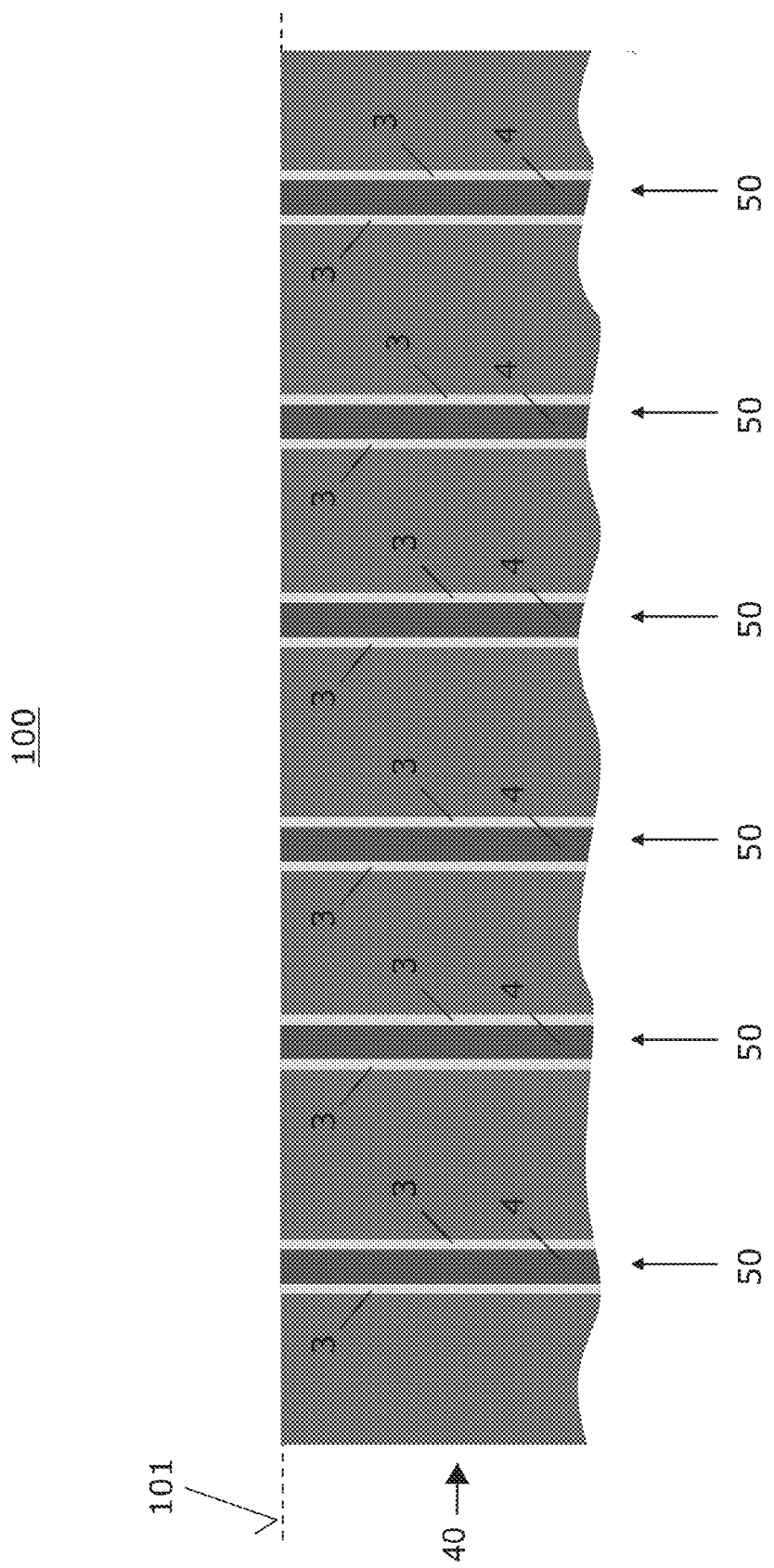
Figure 10:
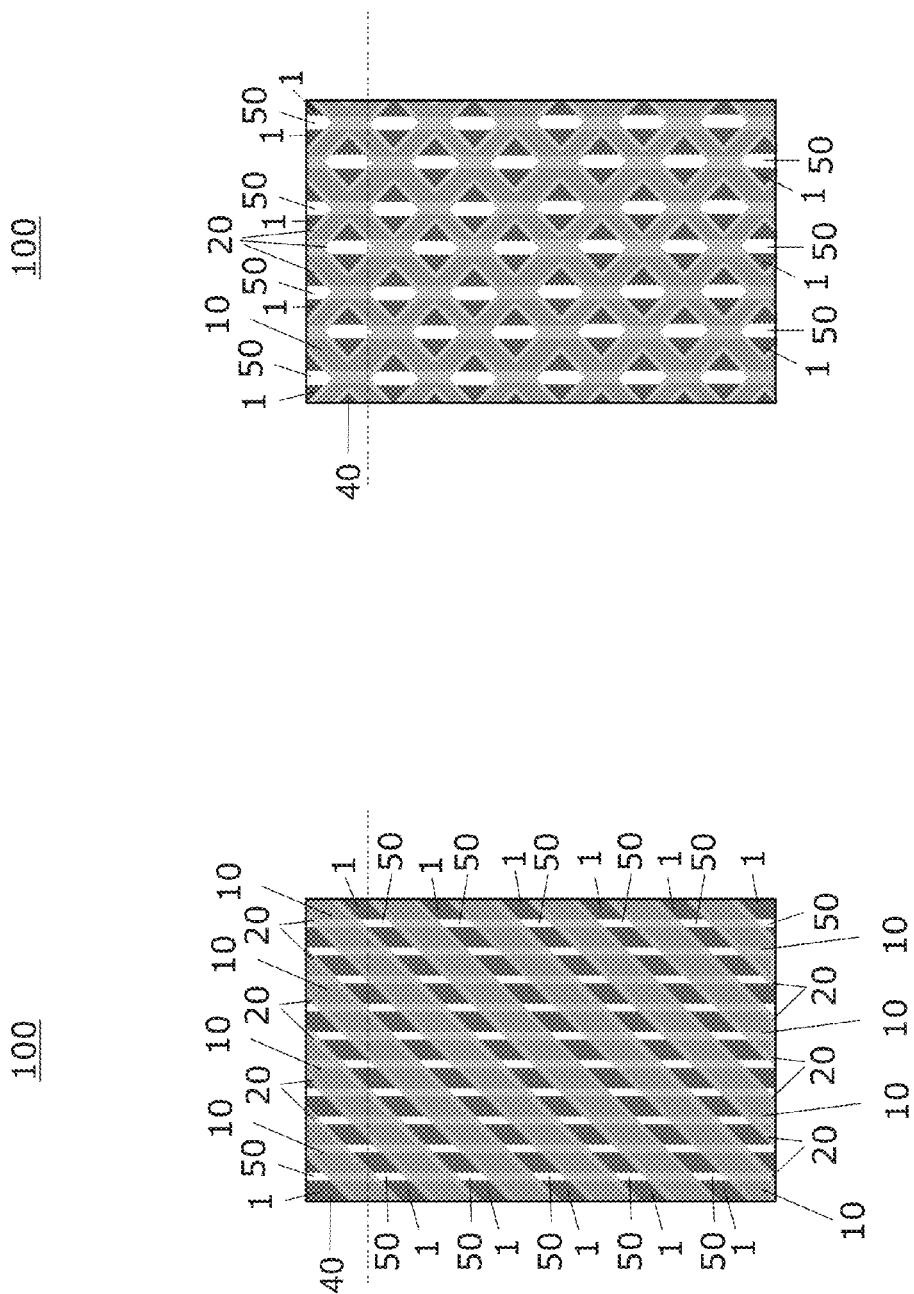
FIGS. 10A and 10B illustrate plane views on a semiconductor body as illustrated in FIG. 7 according to embodiments.

Thereafter, the second support structure 20 may be removed. The resulting structure is illustrated in FIG. 9. Typically, the second support structure 20 is removed by polishing, etching, and/or a CMP-process (Chemical Mechanical Polishing).

Thereafter, further processes of forming several doping regions in the semiconductor mesas 1, forming insulated gate electrodes next to the upper surface 101 and the like may be performed to form a field-effect semiconductor device.

Due to using the first and second support structures 10, 20, semiconductor devices such as TEDFETs with trenches 50 and dielectric regions 3, respectively, having high aspect ratios of more than about 10, more typically more than about 20, for example up 1000 may safely be manufactured.

Referring to FIGS. 11 to 20 illustrating vertical cross-sections through a semiconductor body or wafer 40, method steps of a method for forming a semiconductor device 200 are explained. In a first process, the wafer 40 having an upper surface 101 and a semiconductor layer 1 extending to the upper surface 101 is provided.

Thereafter, wide trenches 51 are etched from the upper surface 101 into the semiconductor layer 1 to form first semiconductor mesas 1 having sidewalls.

Thereafter, sacrificial oxide layers 2 may be formed on the on the sidewalls of the first semiconductor mesas 1 and wide trenches 51, respectively.

Figure 11:
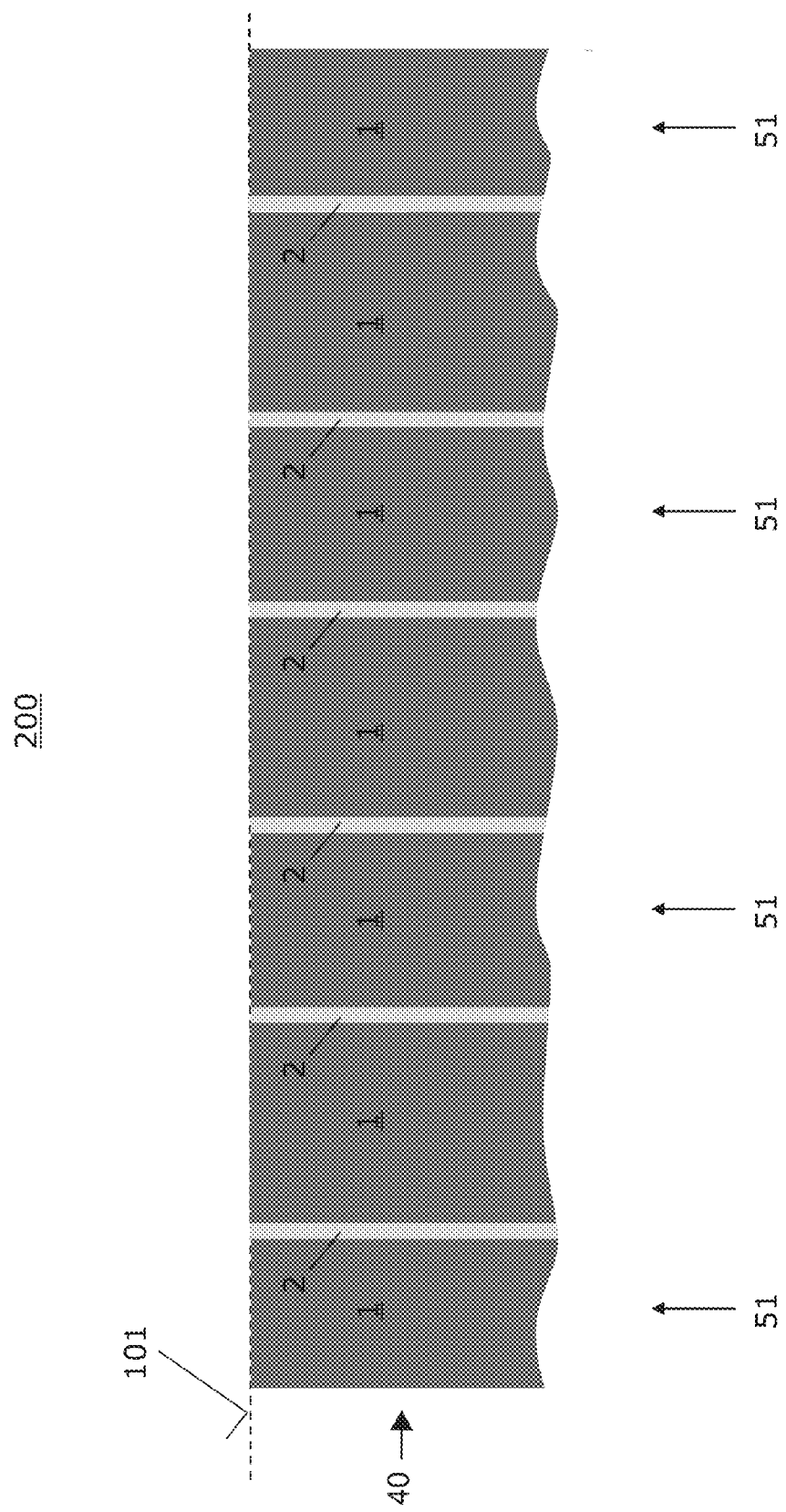
FIGS. 11 and 20 illustrate vertical cross-sections through a semiconductor body during method steps of a method according to further embodiments.

Thereafter, a selective epitaxial growth process may be performed to form second semiconductor mesas 1 in the wide trenches 51 between adjacent sacrificial oxide layers 2. The resulting structure is illustrated in FIG. 11.

Thereafter, a first support structure 10 of an oxidizable material such as amorphous carbon or diamond-like carbon is formed on the upper surface 101 so that adjacent pairs of the first and second semiconductor mesas 1 are bridged by the first support structure 10. This may be done similar as explained above with regard to FIGS. 2 to 4.

Figure 12:
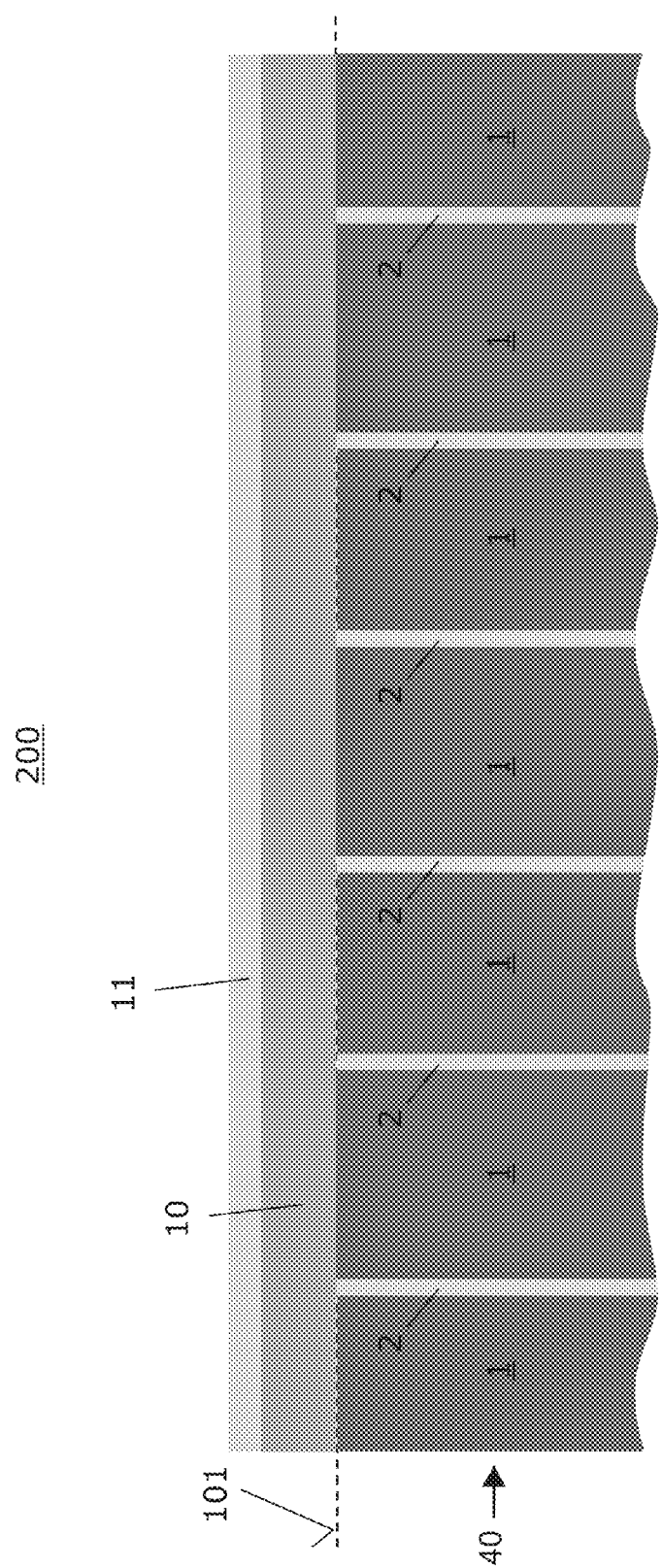

For example, a first layer 10 of amorphous carbon may be deposited on the first and second mesas 1 in a CVD-process and hard-mask layer 11 of e.g. silicon oxide may be deposited on the first layer 10. The resulting structure is illustrated in FIG. 12.

Figure 13:
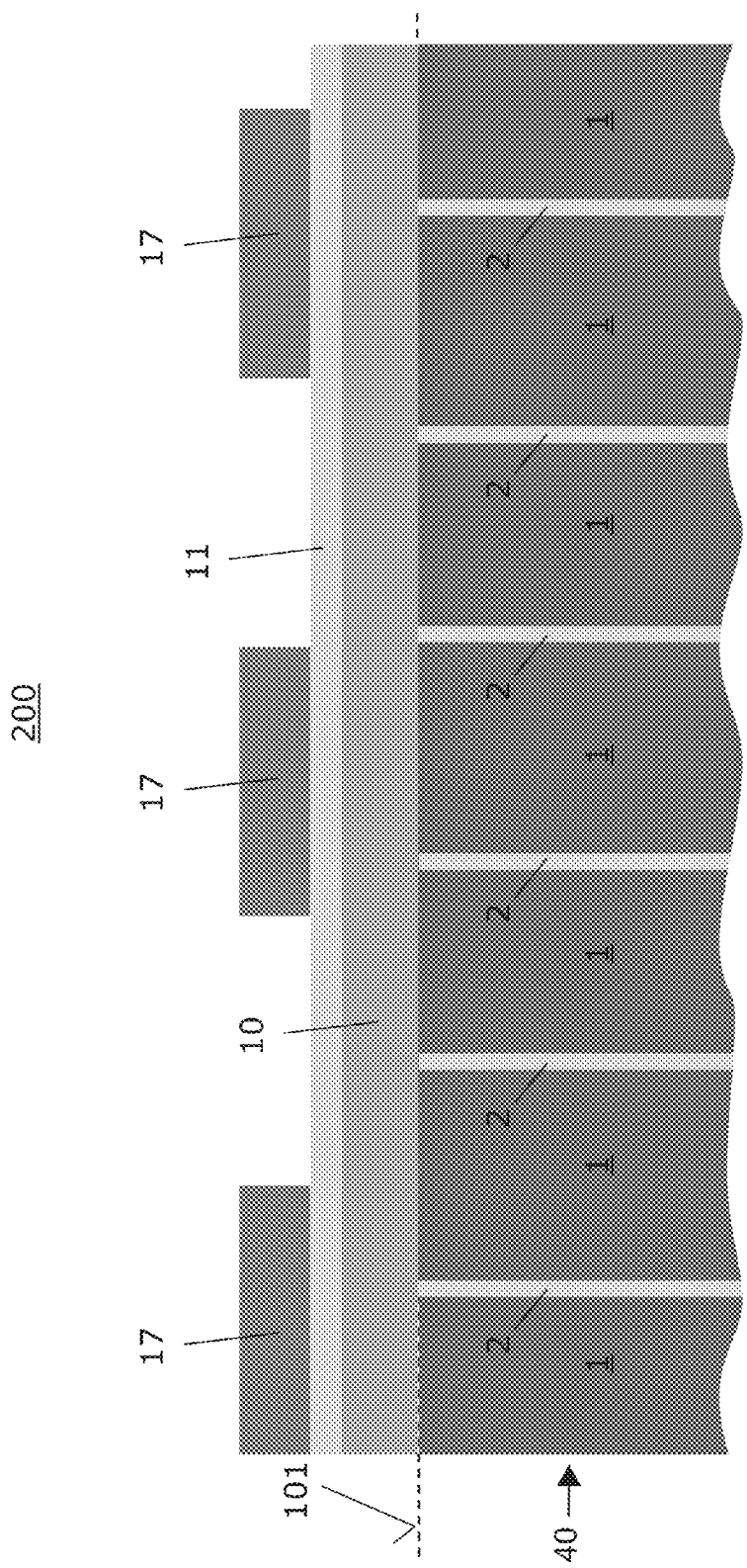

Thereafter, a mask 17 is formed on the hard-mask layer 11 as illustrated in FIG. 13. This typically includes a photolithographic process.

Figure 14:
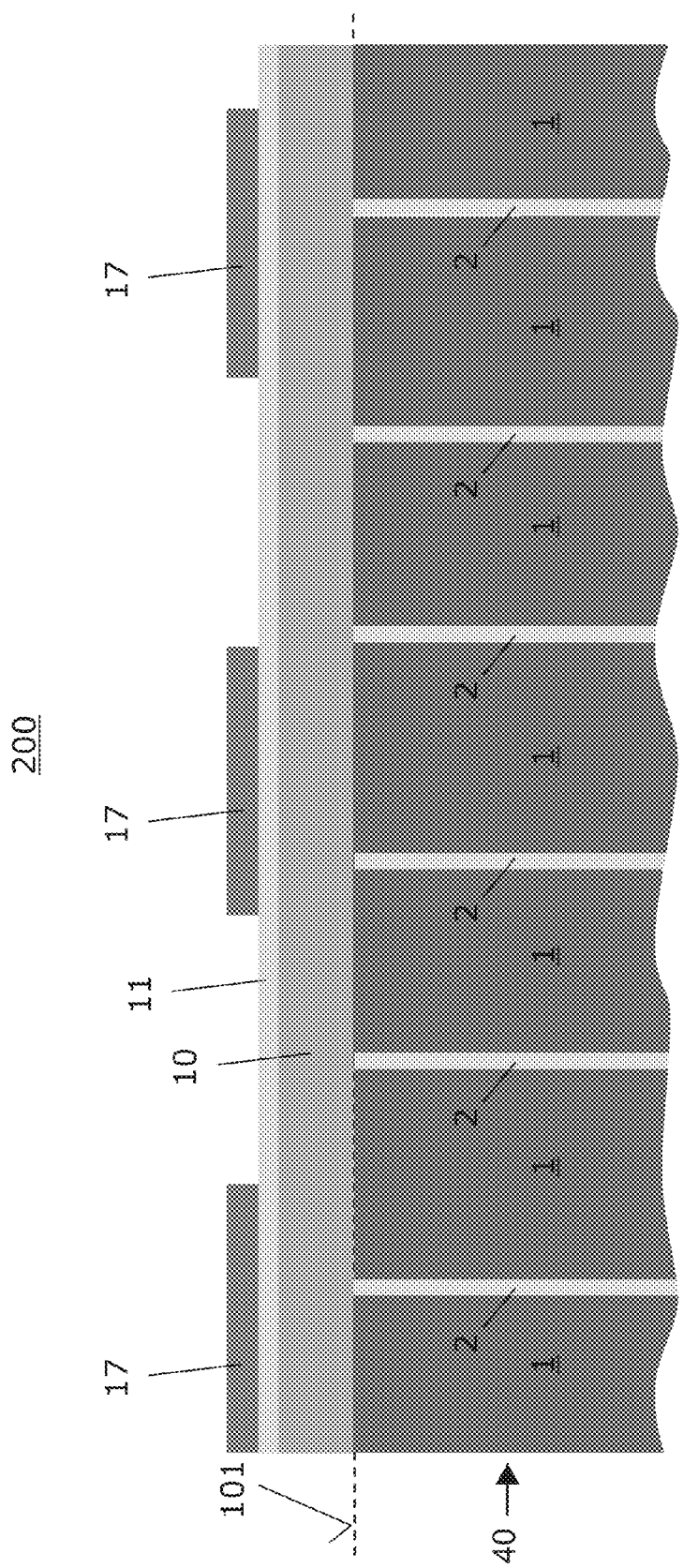

Thereafter, mask 17 is used to etch the hard-mask layer 11 thereby forming a hard-mask 11. The resulting structure is illustrated in FIG. 14.

Figure 15:
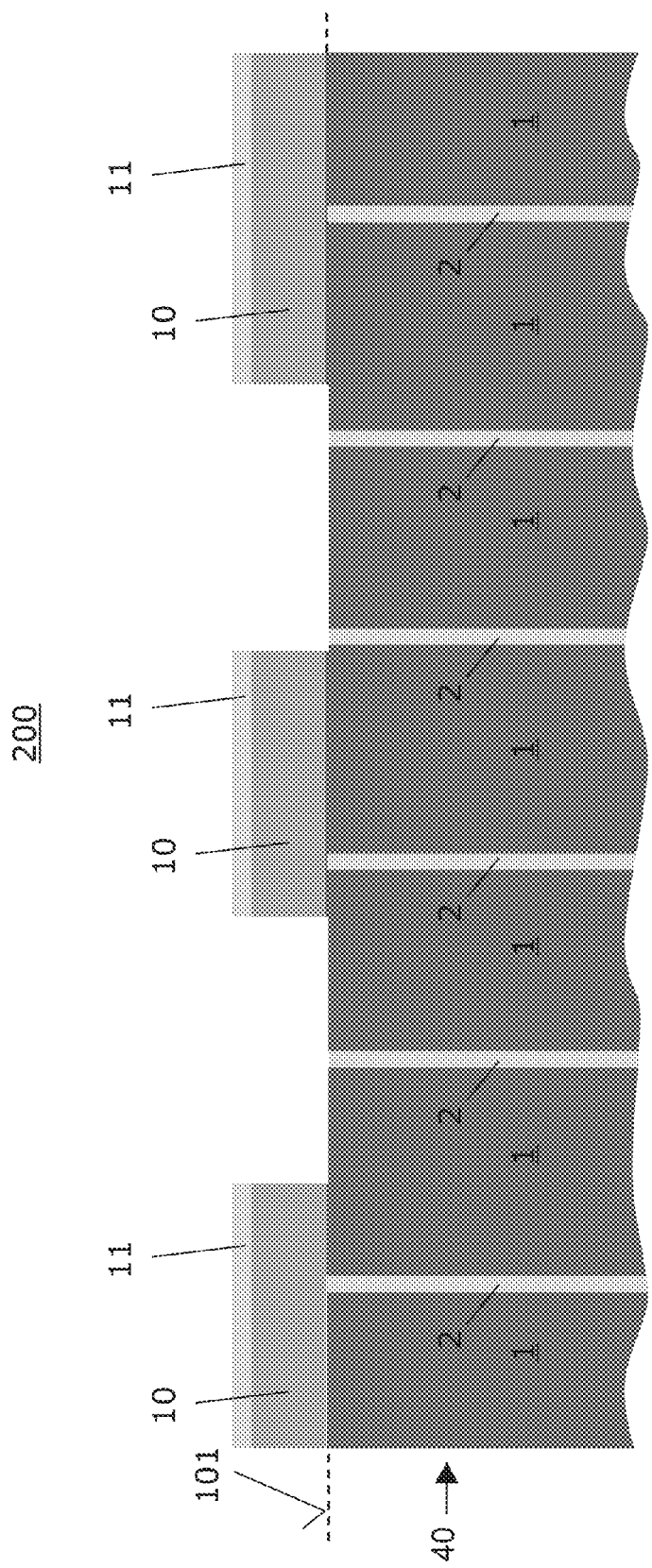
Figure 16:
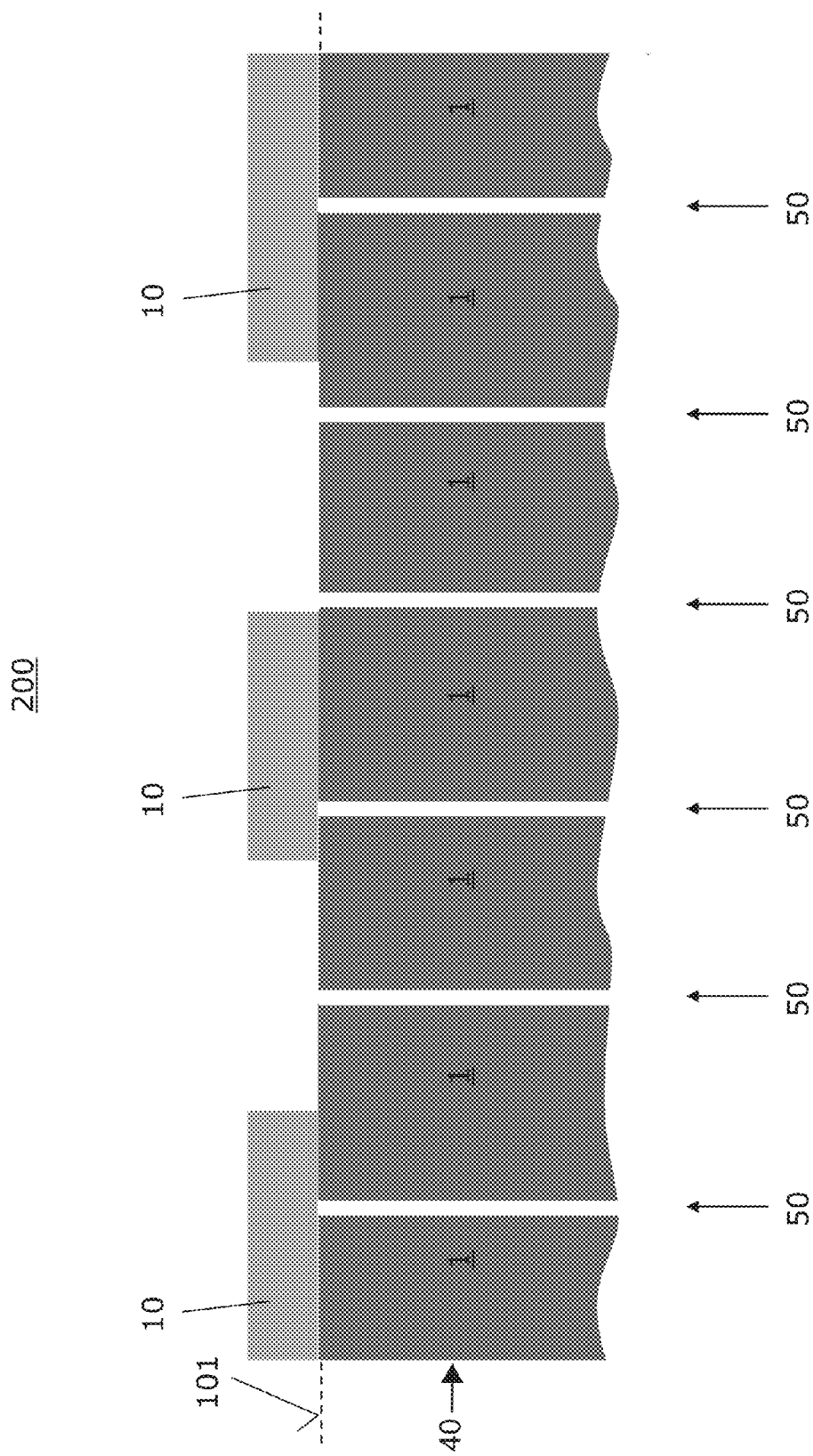

Thereafter, the hard-mask 11 is used to etch the first layer 10 thereby forming a first support structure 10. The resulting structure is illustrated in FIG. 15. Note that all semiconductor mesas 1 are typically bridged by the first support structure 10. Thereafter, the hard-mask 11 may be removed Thereafter, the sacrificial oxide layers 2 may be removed by etching to expose sidewalls of the first and second semiconductor mesas 1. In so doing vertical trenches 50 are formed between the first and second mesas 1. The resulting structure 200 is illustrated in FIG. 16. The first support structure 10, 20 mechanically stabilize the first and second semiconductor mesas 1 during removing the sacrificial oxide layers 2 and typically also during further subsequent processes.

Figure 17:
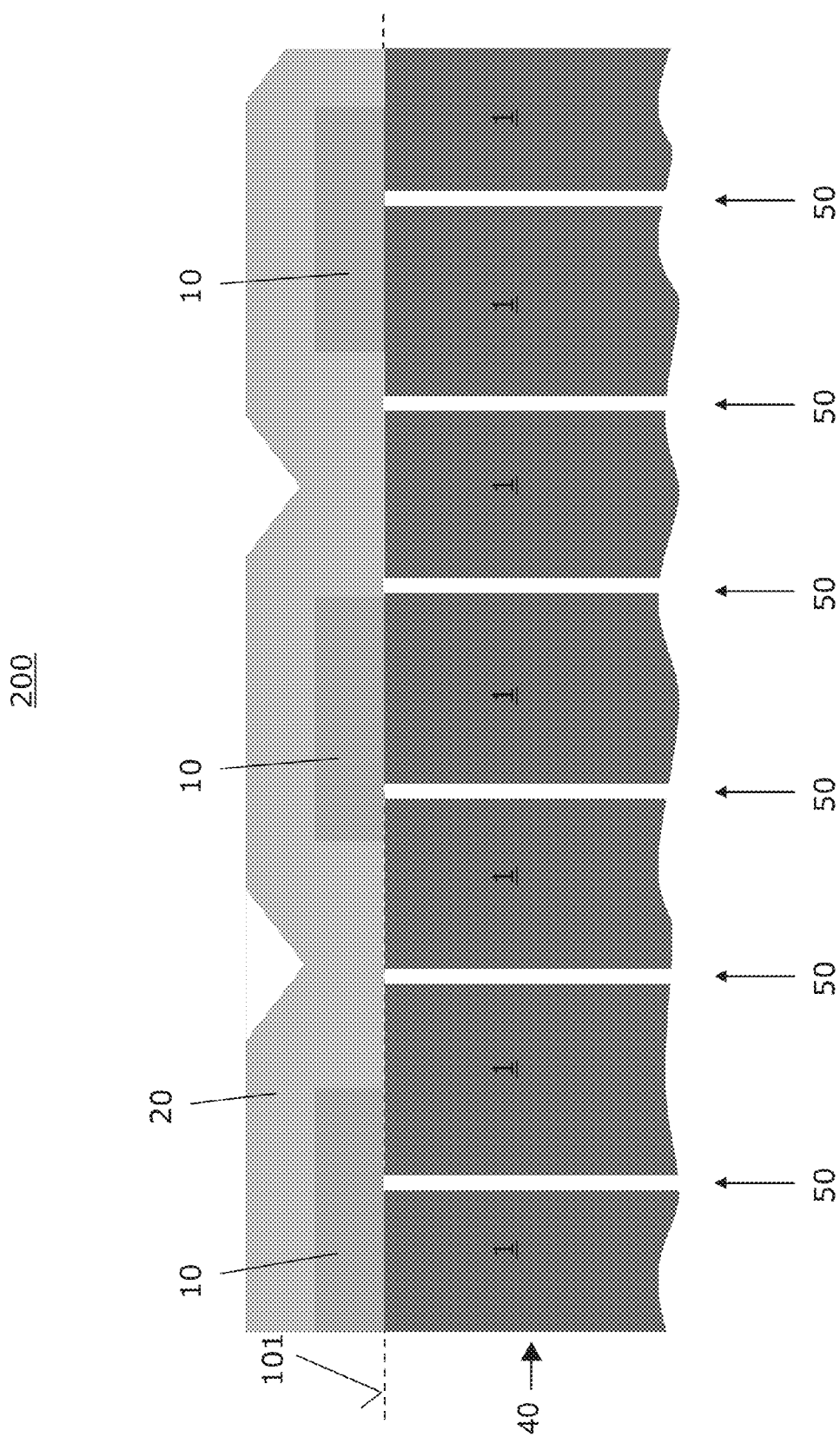

Thereafter, a second support structure 20 of a second material is typically formed on the first and second semiconductor mesas 1. As illustrated in FIG. 17, forming the second support structure 20 typically includes forming a second layer 20 of the second material which adjoins the semiconductor mesas 1 at the upper surface 101.

The second layer 20 is typically formed as a non-conformal layer using, for example, a CVD-process. For example, the second layer 20 may be formed as a non-conformal USG-Layer (Undoped-Silicate-Glass-layer) or TEOS-layer (Tetra-Ethyl-Ortho-Silicate-layer) using a CVD-process.

Figure 18:
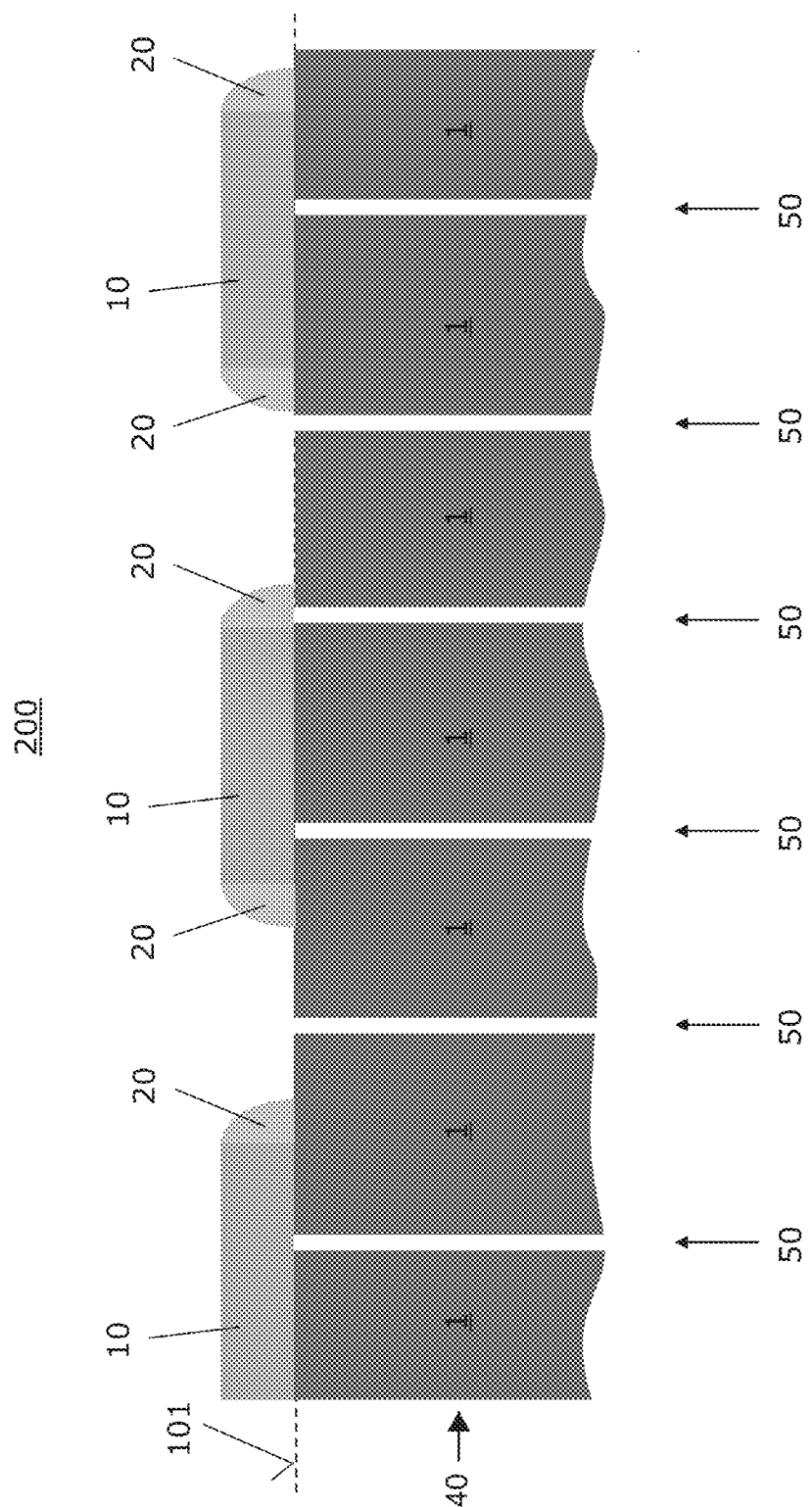

FIG. 18 illustrates the structure after a subsequent unmasked non-isotropic selective etching process of the second layer 20. Accordingly, a second support structure 20 which bridges adjacent pairs of the semiconductor mesas 1 is formed in a self-adjusted manner with respect to the first support structure 10.

Similar as explained above, the first support structure 10 and the second support structure 20 typically adjoin all semiconductor mesas 1 and are substantially arranged only above the plurality of semiconductor mesas 1. Accordingly, the trenches 50 remain substantially free of the materials of the first support structure 10 and the second support structure 20. This facilitates further processing.

When seen from above the first support structure 10 and the second support structure 20 may include adjoining bar-shaped portions that are tilt with respect to the first and second semiconductor mesas 1 similar as explained above with regard to FIG. 10A.

The first support structure 10 may also be formed as a contiguous mesh 1 similar as explained above with regard to FIG. 10B.

Figure 19:
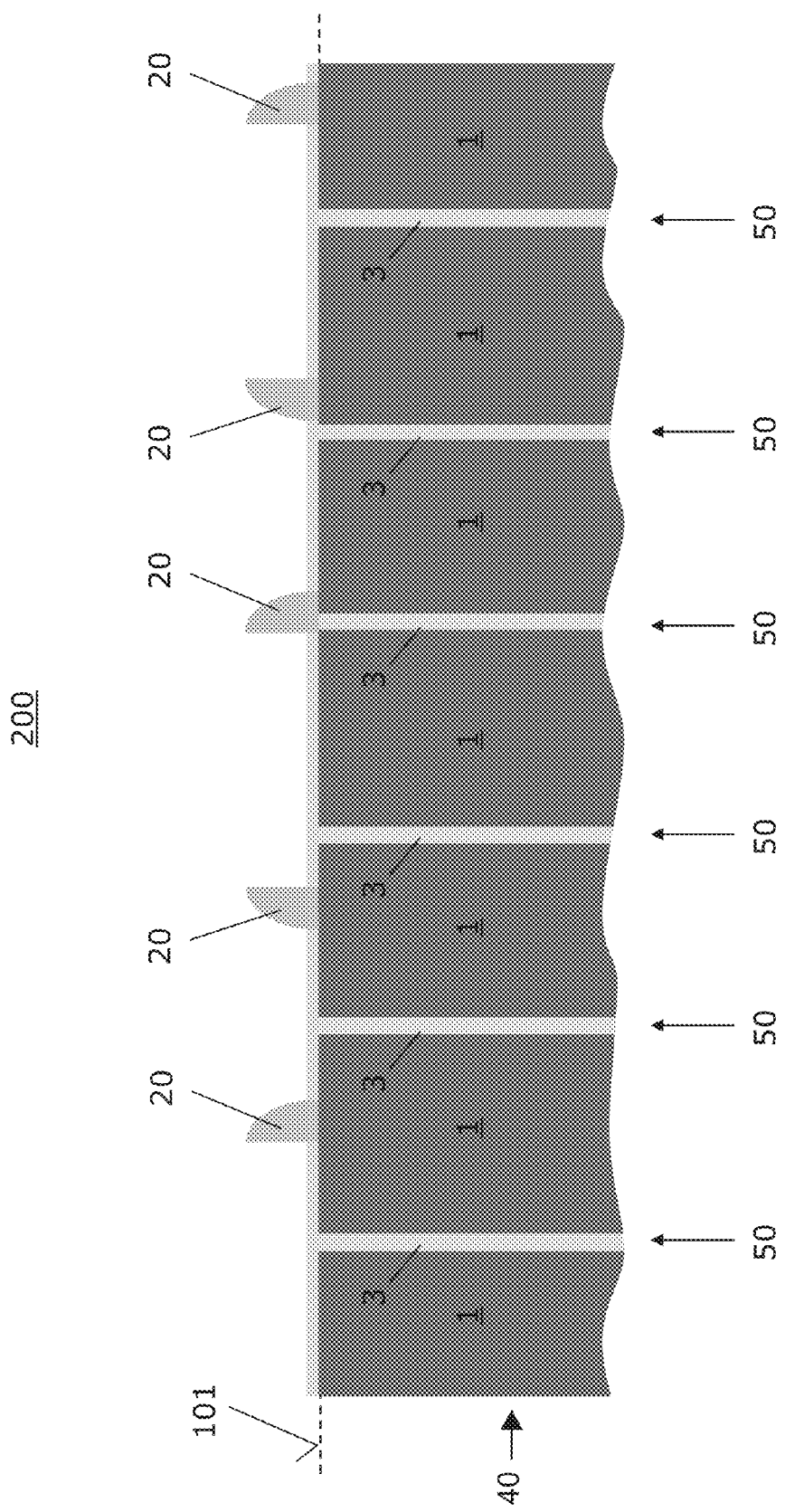

Thereafter, a common thermal oxidizing process may be performed to fill the vertical trenches 50 with a high quality thermal oxide layers 3 and to remove the first support structure 10 by ashing. During the growth of the thermal oxide layers 3 at the sidewalls of the first and second semiconductor mesas 1, the first and second semiconductor mesas 1 are mechanically stabilized by the second support structures 20. The resulting structure 200 is illustrated in FIG. 19.

Figure 20:
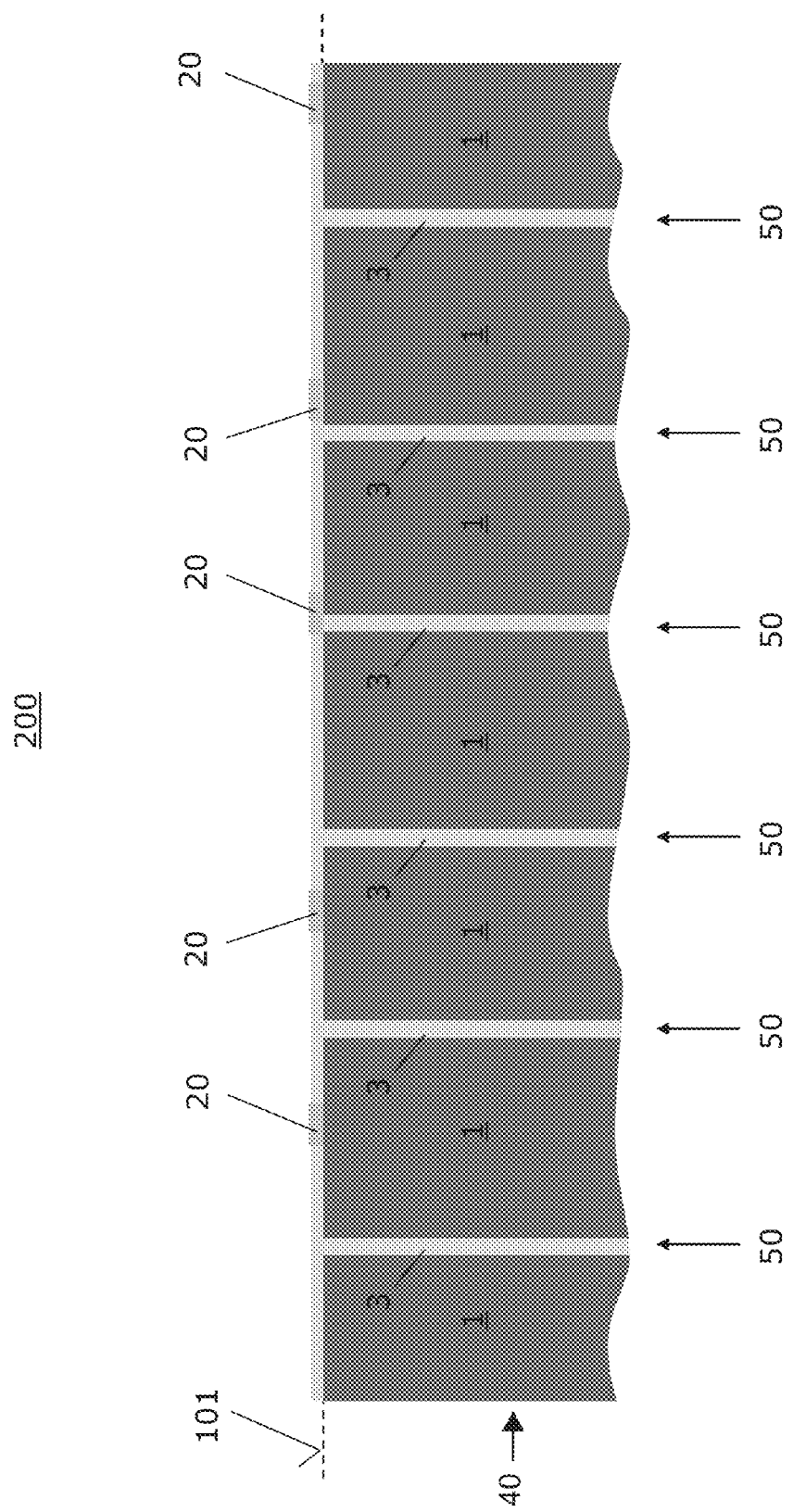

Thereafter, the second support structure 20 may be partly removed from the upper surface 101. The resulting structure is illustrated in FIG. 20. This may be done by polishing, etching, and/or a CMP-process. Note that the second support structure 20 and the thermal oxide 3 may also be completely removed from the upper surface 101.

Thereafter, further processes of forming several doping regions in the semiconductor mesas 1, forming insulated gate electrodes next to the upper surface 101 and the like may be performed to form a field-effect semiconductor device such as a TEDFET.

The methods for forming the semiconductor devices 100, 200 explained above with regard to FIGS. 1 to 10 and 11 to 20 may also be describe as providing in a first process a wafer having an upper surface 101 and a plurality of semiconductor mesas 1 extending to the upper surface 101.

According to an embodiment, the wafer is provided with trenches 50 extending from the upper surface 101 into the wafer and between respective pairs of semiconductor mesas 1. The trenches 50 may already at least partly be filled with respective dielectric regions 2, for example with respective carbon-layers or sacrificial silicon oxide layers covering sidewalls of the semiconductor mesas 1 and/or completely filling the vertical trenches.

Thereafter, a first support structure 10 made a first material and adjoining the plurality of semiconductor mesas 1 at the upper surface 101 is typically formed such that adjacent pairs of the semiconductor mesas 1 are bridged by the first support structure 10 and that the first support structure 10 is substantially arranged only above the upper surface 101.

Thereafter, a second support structure 20 made of a second material and adjoining the plurality of semiconductor mesas 1 at the upper surface 101 is formed such that the adjacent pairs of the semiconductor mesas 1 are bridged by the second support structure 20 and that the second support structure 20 is substantially arranged only above the upper surface 101. The second material is different from the first material. For example, the first material may be an oxidizable material such as carbon, diamond-like carbon or silicon and the second material may be an non-oxidizable material such silicon oxide, silicon nitride or USG. The second material may also be selectively etchable against the first material.

The first and second support structure 10, 20 stabilizes the semiconductor mesas 1 during further processing, for example during further processing side walls of the semiconductor mesas 1 to form high quality dielectric regions 3 between adjacent mesas 1. Accordingly, the breaking off mesas 1 and/or irreversible forming firm contacts between adjacent mesas 1 may be avoided. This facilitates forming of semiconductor devices such as TEDFETs with smaller pitch and/or higher aspect ratio of semiconductor mesas 1 and trenches 50, respectively.

The second support structure 20 is typically formed in a self-aligned manner with respect to the first support structure 10. In so doing, only one lithographical process is required to form the first and second support structures 10, 20.

Note that further support structures may be formed in a self-aligned manner with respect to the first support structure 10 and/or second support structure 20. This increases flexibility of manufacturing without using additional photo masks.

Furthermore, the first support structure 10 and the second support structure 20 may be formed and at least partly removed at different manufacturing stages. For example, the first support structure 10 may be removed prior to or during forming the high quality dielectric regions 3 between adjacent mesas 1, while the second support structure 20 is completely or partly removed thereafter. This increases flexibility of manufacturing and facilitates processing of high aspect ratio trenches and mesas.

The second support structure 20 and the first support structure 10 are typically only formed substantially above the plurality of semiconductor mesas 1. Accordingly, the mesas 1 are stabilized without filling the trenches 50. Non-conformal first and second layers 10, 20 may deposited and subsequently etched to form the first support structure 10 and the second support structure 20, respectively.

For example, the second support structure 20 is formed using a CVD-process to form a non-conformal layer and an un-isotropic etching process or recess-etching of the non-conformal layer.

Typically, the materials and/or vertical extensions and/or deposition conditions of the first support structure 10 and the second support structure 20 are chosen such that the wafer bow is not or almost not changed when the first support structure 10 and/or the second support structure 20 are arranged on the upper surface 101. In embodiments referring to thin wafers, respective layers may also be arranged on a back-side of the wafer to further minimize the influence of the first support structure 10 and the second support structure 20, respectively, on wafer bow.

After finally processing the trenches 50 and regions between the semiconductor mesas 1, respectively, the first support structure 10 and the second support structure 20 may be removed from the upper surface 101 and further processes of, for example, forming field-effect structures in the mesas 1 may be performed at or close to the upper surface 101.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for forming a semiconductor device, comprising:
   providing a wafer comprising an upper surface and a plurality of semiconductor mesas extending to the upper surface, adjacent pairs of the semiconductor mesas of the plurality of semiconductor mesas being separated from each other by at least one of a trench extending from the upper surface into the wafer, and a non-semiconductor region arranged on a side-wall of the trench;
   forming a first support structure comprising a first material above the upper surface and adjoining the plurality of semiconductor mesas at the upper surface so that the adjacent pairs of the semiconductor mesas are bridged by the first support structure;
   forming a second support structure comprising a second material above the upper surface and adjoining the plurality of semiconductor mesas at the upper surface so that the adjacent pairs of the semiconductor mesas are bridged by the second support structure, the second material being different from the first material;
   removing the first support structure; and
   at least partly removing the second support structure.

2. The method of claim 1, wherein the second support structure is formed in a self-adjusted manner with respect to the first support structure.

3. The method of claim 1, wherein forming the second support structure comprises at least one of forming a non-conformal layer of the second material using a CVD-process, and an un-isotropic etching process of the non-conformal layer.

4. The method of claim 1, wherein the second material is selected from a group consisting of a silicon oxide, TEOS, USG, silicon nitride, an imide and silicon.

5. The method of claim 1, wherein the second support structure adjoins the first support structure.

6. The method of claim 1, wherein an extension of the second support structure in a direction which is perpendicular to the upper surface is in a range from about 100 nm to about 5 μm.

7. The method of claim 1, wherein forming the first support structure comprises at least one of forming a layer of the first material using a CVD-process in a hydrocarbon atmosphere, and masked etching the layer.

8. The method of claim 1, wherein the first material is selected from a group consisting of carbon, diamond-like carbon, silicon-nitride, an imide, and silicon.

9. The method of claim 1, wherein an extension of the first support structure in a direction which is perpendicular to the upper surface is in a range from about 100 nm to about 5 µm.

10. The method of claim 1, wherein at least one of the trench and the non-semiconductor region comprises, in a cross-section which is perpendicular to the upper surface, an aspect ratio of more than about 10.

11. The method of claim 1, further comprising removing the non-semiconductor region after forming the first support structure.

12. The method of claim 11, wherein the second support structure is formed after removing the non-semiconductor region.

13. The method of claim 1, further comprising forming a dielectric layer on the side-wall of the vertical trench prior to at least partly removing the second support structure.

14. The method of claim 13, wherein forming the dielectric layer and removing the first support structure comprise a common oxidation process.

15. The method of claim 1, wherein at least partly removing the second support structure comprises at least one of polishing, etching, and a CMP-process.

16. The method of claim 1, wherein the semiconductor mesas are substantially bar-shaped when seen from above, and wherein the method is performed such that at least one of the first support structure and the second support structure comprise, when seen from above, bar-shaped portions that are tilted with respect to the semiconductor mesas.

17. The method of claim 1, wherein the first support structure is formed as a contiguous mesh.

18. A method for forming a TEDFET, comprising:
providing a wafer comprising an upper surface and a semiconductor layer extending to the upper surface;
etching wide trenches from the upper surface into the semiconductor layer to form first semiconductor mesas comprising sidewalls;
forming sacrificial oxide layers on the sidewalls of the first semiconductor mesas;
performing a selective epitaxial growth process to form second semiconductor mesas in the wide trenches between adjacent sacrificial oxide layers;
forming on the upper surface a first support structure of a oxidizable material so that adjacent pairs of the first and second semiconductor mesas are bridged by the first support structure;
removing the sacrificial oxide layers to expose sidewalls of the first and second semiconductor mesas;
forming on the upper surface a second support structure of a non-oxidizable material so that adjacent pairs of the first and second semiconductor mesas are bridged by the second support structure;
thermal oxidizing at least the sidewalls of the first and second semiconductor mesas; and
at least partly removing the second support structure.

19. The method of claim 18, wherein the first support structure is substantially removed during thermal oxidizing at least the sidewalls.

20. A method for forming a semiconductor device, comprising:
providing a wafer comprising an upper surface and a plurality of semiconductor mesas which extend to the upper surface and are, next to the upper surface and in a cross-section which is substantially orthogonal to the upper surface, spaced apart from each other;
forming a first support structure comprising a first material and adjoining the plurality of semiconductor mesas at the upper surface so that adjacent pairs of the semiconductor mesas are bridged by the first support structure and that the first support structure is substantially arranged only above the upper surface;
forming a second support structure comprising a second material and adjoining the plurality of semiconductor mesas at the upper surface so that the adjacent pairs of the semiconductor mesas are bridged by the second support structure and that the second support structure is substantially arranged only above the upper surface, the second material being different from the first material;
processing a side wall of at least one of the plurality of semiconductor mesas;
removing the first support structure; and
at least partly removing the second support structure.

21. The method of claim 20, wherein the wafer is provided with trenches extending from the upper surface into the wafer and between respective pairs of semiconductor mesas.

22. The method of claim 20, wherein the wafer is provided with non-semiconductor regions arranged between respective pairs of semiconductor mesas.

23. The method of claim 20, wherein the second support structure is formed in a self-adjusted manner with respect to the first support structure.

24. The method of claim 20, wherein forming the second support structure comprises at least one of forming a non-conformal layer of the second material using a CVD-process, and a non-isotropic etching process of the non-conformal layer.

25. The method of claim 1, wherein the adjacent pairs of the semiconductor mesas are bridged by the first support structure extending over the trench such that the first support structure does not extend into the trench.

26. The method of claim 1, wherein the first and second support structure are formed such that both the first and second support structure simultaneously adjoin the upper surface.

27. A method for forming a semiconductor device, comprising:
providing a wafer comprising an upper surface and a plurality of semiconductor mesas extending to the upper surface, adjacent pairs of the semiconductor mesas of the plurality of semiconductor mesas being separated from each other by at least one of a trench extending from the upper surface into the wafer, and a non-semiconductor region arranged on a side-wall of the trench;
forming a first support structure comprising a first material and adjoining the plurality of semiconductor mesas at the upper surface so that the adjacent pairs of the semiconductor mesas are bridged by the first support structure;
forming a second support structure comprising a second material and adjoining the plurality of semiconductor mesas at the upper surface so that the adjacent pairs of the semiconductor mesas are bridged by the second support structure, the second material being different from the first material;
removing the first support structure;
at least partly removing the second support structure; and
removing the non-semiconductor region after forming the first support structure.

* * * * *